United States Patent
Schubert et al.

(10) Patent No.: US 10,181,495 B1
(45) Date of Patent: Jan. 15, 2019

(54) MULTI-COLOR MONOLITHIC LIGHT-EMITTING DIODES AND METHODS FOR MAKING THE SAME

(71) Applicant: X Development LLC, Mountain View, CA (US)

(72) Inventors: Martin Friedrich Schubert, Mountain View, CA (US); Michael Jason Grundmann, San Jose, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/851,602

(22) Filed: Dec. 21, 2017

(51) Int. Cl.
*H01L 21/20* (2006.01)
*H01L 21/36* (2006.01)
*H01L 29/06* (2006.01)
*H01L 31/00* (2006.01)
*H01L 29/20* (2006.01)
*H01L 27/15* (2006.01)
*H01L 21/308* (2006.01)
(Continued)

(52) U.S. Cl.
CPC .............. *H01L 27/156* (2013.01); *C25F 3/12* (2013.01); *C25F 3/14* (2013.01); *H01L 21/308* (2013.01); *H01L 21/30635* (2013.01); *H01L 22/24* (2013.01); *H01L 33/06* (2013.01); *H01L 33/38* (2013.01); *H01L 33/502* (2013.01); *B82Y 20/00* (2013.01); *B82Y 40/00* (2013.01); *H01L 2933/0016* (2013.01); *H01L 2933/0041* (2013.01); *H01L 2933/0083* (2013.01); *Y10S 977/774* (2013.01); *Y10S 977/816* (2013.01); *Y10S 977/818* (2013.01); *Y10S 977/819* (2013.01); *Y10S 977/824* (2013.01); *Y10S 977/88* (2013.01); *Y10S 977/888* (2013.01);
(Continued)

(58) Field of Classification Search
CPC ....... B82Y 40/00; B82Y 20/00; H01S 5/3412; Y10S 977/774; Y10S 977/815–977/821; Y10S 977/824; H01L 33/06; H01L 33/502; H01L 27/156
USPC ....... 977/774, 950; 438/478, 962, 34; 257/9, 257/13, 89, E33.008, E29.071
See application file for complete search history.

(56) References Cited

U.S. PATENT DOCUMENTS 7,279,716 B2   10/2007  Chen
9,276,382 B2   3/2016   Fischer et al.
(Continued)

OTHER PUBLICATIONS

Li et al. "Computing Equilibrium Shapes of Wurtzite Crystals: The Example of GaN," 1411.4839v2, Aug. 25, 2015, 5 pages.
(Continued)

*Primary Examiner* — Fernando L Toledo
*Assistant Examiner* — Aaron Gray
(74) *Attorney, Agent, or Firm* — Fish & Richardson P.C.

(57) ABSTRACT

A process for producing a light emitting diode device, the process including: forming a plurality of quantum dots on a surface of a layer including a first area and a second area, the forming including: exposing the first area of the surface to light having a first wavelength while exposing the first area to a quantum dot forming environment that causes the quantum dots in the first area to form at a first growth rate while the quantum dots have a dimension less than a first threshold dimension; exposing the second area of the surface to light having a second wavelength while exposing the second area to the quantum dot forming environment that causes the quantum dots in the second area to form at a third growth rate while the quantum dots have a dimension less than a second threshold dimension; and processing the layer to form the LED device.

14 Claims, 10 Drawing Sheets

(51) Int. Cl.
  H01L 21/66    (2006.01)
  H01L 33/50    (2010.01)
  H01L 33/38    (2010.01)
  C25F 3/12     (2006.01)
  C25F 3/14     (2006.01)
  H01L 21/3063  (2006.01)
  H01L 33/06    (2010.01)
  B82Y 20/00    (2011.01)
  B82Y 40/00    (2011.01)
(52) U.S. Cl.
  CPC ........ Y10S 977/891 (2013.01); Y10S 977/892 (2013.01); Y10S 977/95 (2013.01); Y10S 977/952 (2013.01)

(56) References Cited

U.S. PATENT DOCUMENTS

| | | | |
|---|---|---|---|
| 2013/0037778 A1* | 2/2013 | Kazlas | B82Y 10/00 257/9 |
| 2013/0056705 A1* | 3/2013 | Kim | G03F 7/0002 257/13 |
| 2015/0270136 A1* | 9/2015 | Fischer | H01S 5/34333 438/746 |
| 2015/0364523 A1* | 12/2015 | Sato | H01L 51/502 257/13 |
| 2017/0229429 A1* | 8/2017 | He | H01L 33/502 |

OTHER PUBLICATIONS

Ozaki et al. "Integration of Emission-wavelength-controlled InAs Quantum Dots for Ultra-broadband Near-infrared Light Source," Nanomaterials and Nanotechnology, Received Feb. 18, 2014, Accepted Sep. 11, 2014, 17 pages.

Xiao et al. "Quantum-Size-Controlled Photoelectrochemical Fabrication of Epitaxial InGaN Quantum Dots," Nano Letters, Aug. 29, 2014, 5 pages.

Zhang et al. "A conductivity-based selective etching for next generation GaN devices," Phys. Status Solidi B 247(7), Jul. 2010, 4 pages.

* cited by examiner

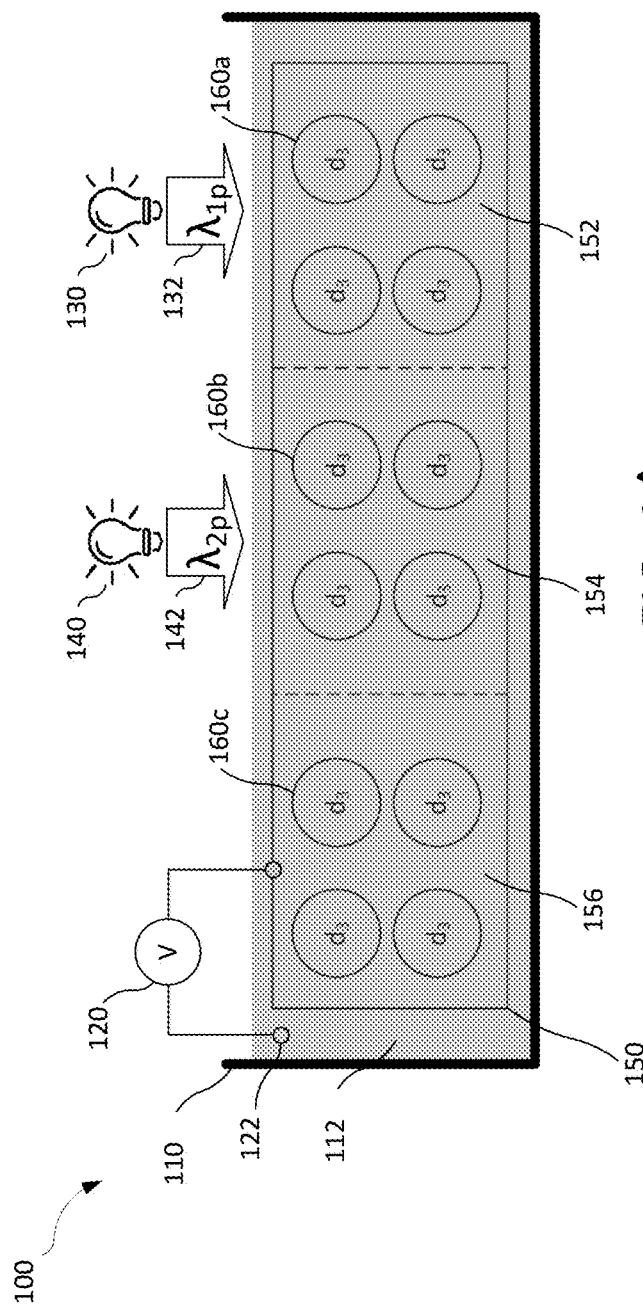
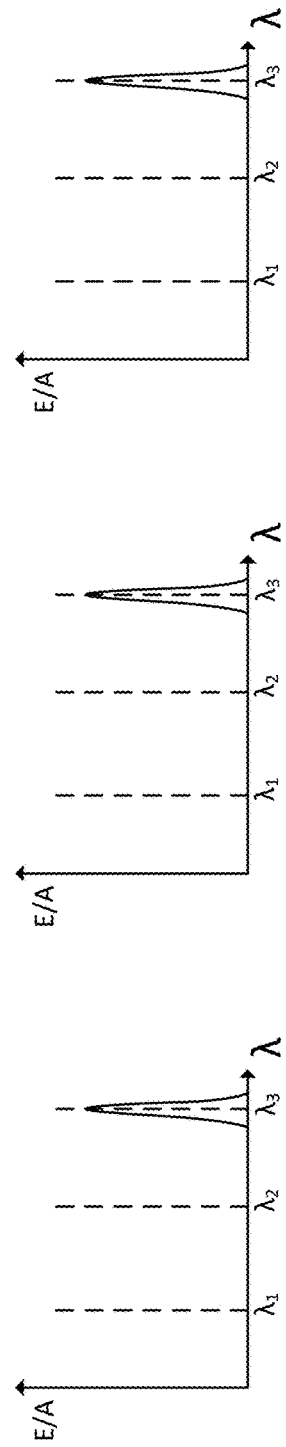
FIG. 1A
FIG. 1B
FIG. 1C
FIG. 1D

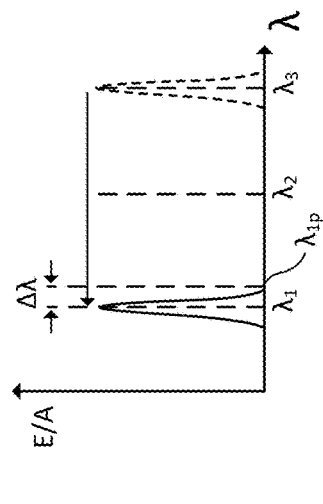
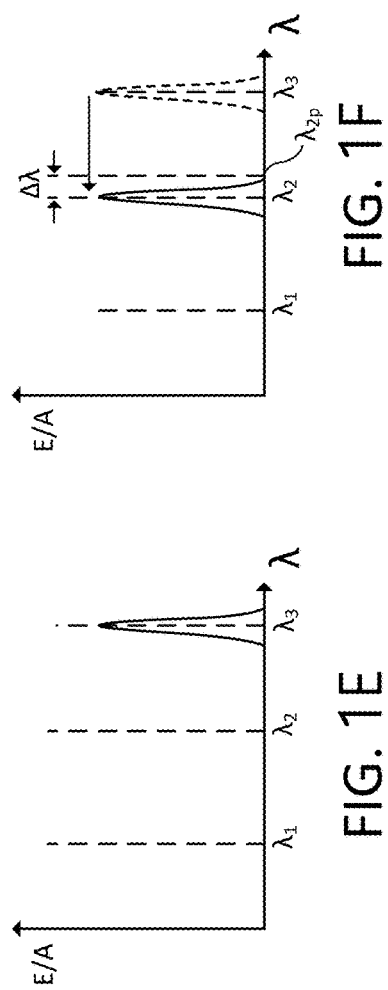
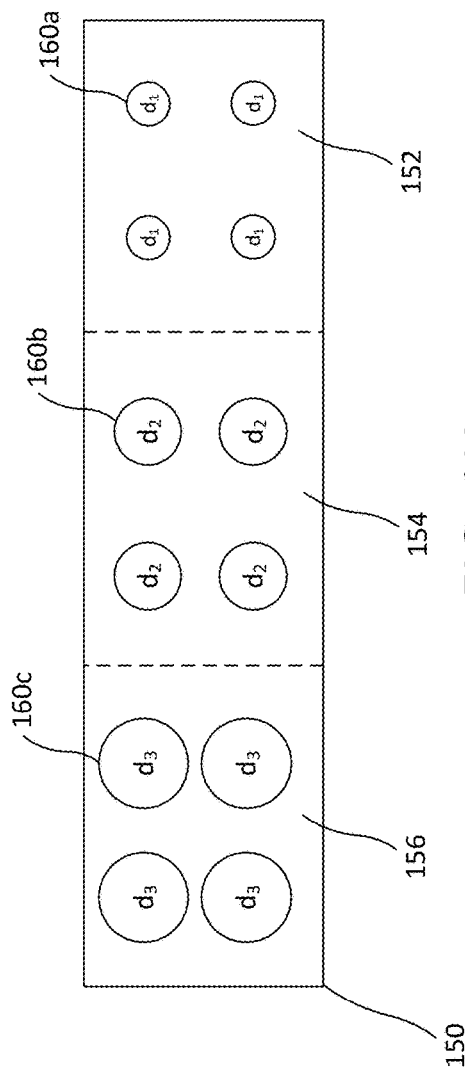

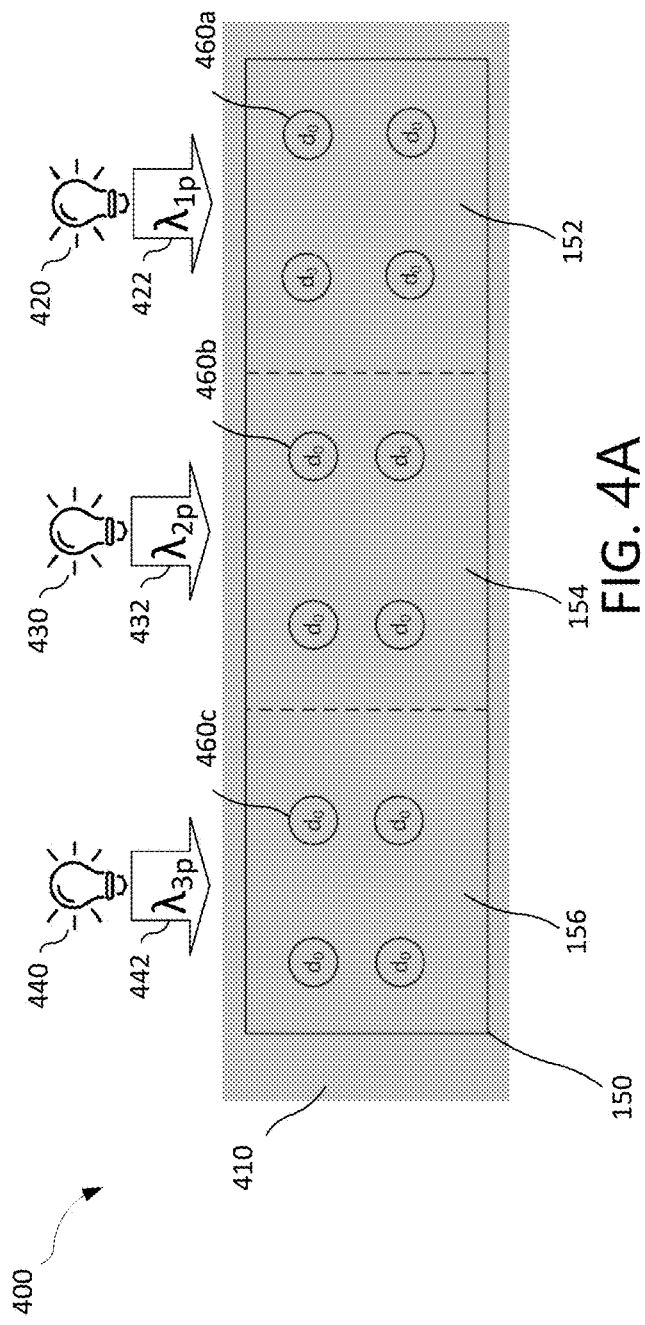
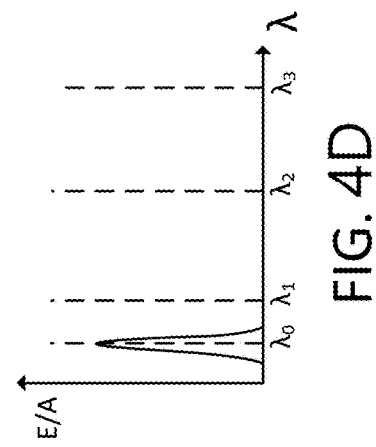
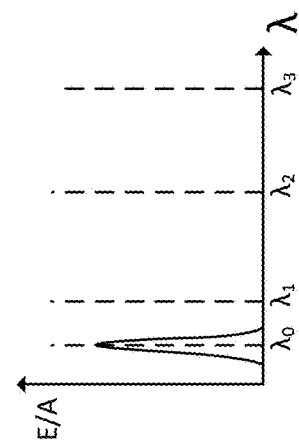
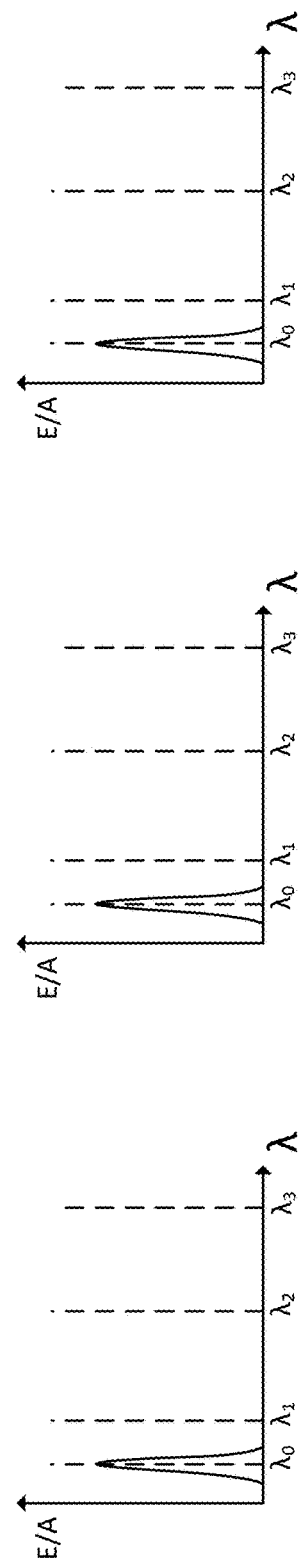

MULTI-COLOR MONOLITHIC LIGHT-EMITTING DIODES AND METHODS FOR MAKING THE SAME

TECHNICAL FIELD

This disclosure generally relates to light emitting devices and methods of making the light emitting devices.

BACKGROUND

In its simplest form, a light-emitting diode (LED) is a light source composed of a p-n junction diode that emits light when activated. When a suitable voltage is applied to electrical contacts on opposing sides of the junction, electrons are able to recombine with holes within an active region of the device, releasing energy in the form of photons. The wavelengths of the emitted light and correspondingly, the color of the LED for visible wavelengths, is generally determined by the energy band gap of the semiconductor. LEDs are often small devices (e.g., less than 1 mm$^2$) and integrated optical components may be used to shape the radiation pattern.

Generally, LEDs can be formed from inorganic or organic semiconductor materials. An inorganic LED (ILED) is formed using inorganic materials such as compound semiconductors (e.g., InGaAs, InGaN). Compared to organic LEDs (OLEDs) formed using organic materials, ILEDs are capable of generating light at a significantly higher power efficiency at a brightness per unit area that is several orders of magnitude higher (e.g., 1,000×~10,000×) than that of OLEDs.

Due to the high efficiency of ILED devices, extremely small inorganic LEDs can yield sufficient light to be practically useful for applications like displays or general illumination sources. LED dies having active areas of 100 μm$^2$ or less and a thickness of 10 μm or less can generate light visible to the human eye at drive currents on the order of tens of nanoamps. Such devices are often referred to as microLEDs, mLEDs, or μLEDs. Generally, microLEDs have an active area in a range from 1 μm$^2$ to about 2500 μm$^2$ and are manufactured using conventional semiconductor manufacturing techniques. As a result, microLEDs can have many different geometries, as specific applications demand.

As noted above, the wavelength emitted by an LED is primarily set by the material composition, e.g., the compound semiconductor forming the diode. Additionally, depositing multiple layers of the compound semiconductor is often difficult or infeasible for variety of reasons including manufacturing process complexity and cost considerations. Therefore, fabricating ILEDs emitting at different wavelengths (e.g., red, green, blue) on a common substrate ("monolithic integration") to form an integrated device may be a challenge.

SUMMARY

This disclosure features LED devices that monolithically integrate inorganic light emitting diodes (ILEDs) emitting light at two or more distinct wavelength bands (e.g., different colored light), and methods for fabricating such devices.

One way of controlling emission wavelengths of a compound semiconductor is by forming a nanoparticle from the light-emitting material and controlling the dimension of the nanoparticle. Such a nanoparticle is commonly referred to as a quantum dot. A quantum dot typically ranges from 2 nm to 50 nm in size, in which quantum confinement of electrons or holes affect the emission and absorption wavelength of the constituent material. By depositing a layer of quantum dots of a particular size, followed by a selective modification of the size of the quantum dots (e.g., by etching or growth) at various regions of the substrate, ILEDs having different emission wavelengths can be formed on the same substrate without depositing multiple layers of compound semiconductors for each wavelength.

In some embodiments, selective modification of the size of quantum dots is achieved using photoelectrochemical (PEC) etching. PEC etching is a light-induced electrochemical etching of semiconductors, where regions of a material that are exposed to and absorb the illuminated light are selectively etched. The electron-hole pair generated by the absorption of light allows the material to be etched, so illuminated areas that do not absorb the light do not get etched. As absorption wavelengths of the quantum dots change with the size of the quantum dots, etching of the quantum dots causes a corresponding change in the absorption wavelength. As quantum dots become smaller in size, the absorption wavelength decreases. Therefore, for a fixed illumination wavelength, the etching will effectively self-terminate once the size of the quantum dots are etched down past a size corresponding to the illumination wavelength, enabling precise control over the absorption wavelength, and therefore the emission wavelength, of the quantum dots.

Another way of controlling the size of the quantum dots is through in-situ control of the growth rate of the quantum dots, utilizing the illumination-controlled growth process. Absorption of light by the quantum dots affects the balance between adsorption and desorption during the quantum dot growth process. As a result, photoabsoprtion (i.e., absorption of illuminated light) can cause a decrease in growth rate, and in certain conditions, reduce the growth rate to an extent that practically stops, or clamps, the growth of the quantum dot. As absorption wavelengths of the quantum dots change with the size of the quantum dots, growth causing an increase in the size of the quantum dots causes a corresponding change in the absorption wavelength. As quantum dots grows in size, the absorption wavelength increases. Therefore, for a fixed illumination wavelength, the growth will slow down, or stop all together, once the size of the quantum dots reaches a size corresponding to the illumination wavelength, enabling precise control over the absorption wavelength, and therefore the emission wavelength, of the quantum dots.

In general, in a first aspect, the invention features a process for producing a light emitting diode (LED) device, the process including: forming a plurality of quantum dots on a surface of a layer including a first area and a second area; exposing the first area of the surface to light having a first wavelength while exposing the first area to a first etchant that, due at least in part to an interaction between the light at the first wavelength and the quantum dots, causes the quantum dots in the first area to be etched at a first etch rate while the quantum dots have a dimension at or greater than a first threshold dimension, and at a second etch rate while the quantum dots have a dimension less than the first threshold dimension, the first etch rate being higher than the second etch rate; exposing the second area of the surface to light having a second wavelength shorter than the first wavelength while exposing the second area to a second etchant that, due at least in part to an interaction between the light at the second wavelength and the quantum dots, causes the quantum dots in the second area to be etched at a third etch rate while the quantum dots have a dimension at or greater than a second threshold dimension, and at a fourth etch rate while the quantum dots have a dimension less than the second threshold dimension, the second threshold dimension being smaller than the first threshold dimension, the third etch rate being higher than the fourth etch rate; and processing the etched layer to form the LED device, wherein the quantum dots in the first area are sized to emit light substantially within a first band of wavelengths and the quantum dots in the second area are sized to emit light substantially within a second band of wavelengths different from the first band of wavelengths.

Embodiments of the system can include one or more of the following features. For example, the exposing the first area of the surface to light having a first wavelength while exposing the first area to the first etchant can include: applying a first voltage between the first etchant and the plurality of quantum dots, and the exposing the second area of the surface to light having the second wavelength shorter than the first wavelength while exposing the second area to the second etchant can include: applying a second voltage between to the second etchant and the plurality of quantum dots.

In some embodiments, the exposing the first area of the surface to light having a first wavelength while exposing the first area to the first etchant can include: measuring a first current between the first etchant and the plurality of quantum dots; determining that the first current is equal to or less than a first threshold current; and based on the determination that the first current is equal to or less than the first threshold current, stopping the exposure of the surface to light having the first wavelength, and the exposing the second area of the surface to light having the second wavelength shorter than the first wavelength while exposing the second area to the second etchant can include: measuring a second current between the second etchant and the plurality of quantum dots; determining that the second current is equal to or less than a second threshold current; and based on the determination that the second current is equal to or less than the second threshold current, stopping the exposure of the surface to light having the second wavelength.

In some embodiments, the exposing the first area of the surface to light having a first wavelength while exposing the first area to a first etchant can include: tuning the first wavelength from an initial first wavelength to a final first wavelength during the etching of the first area. The exposing the second area of the surface to light having a second wavelength shorter than the first wavelength while exposing the second area to a second etchant can include: tuning the second wavelength from an initial second wavelength to a final second wavelength during the etching of the second area.

In some embodiments, the exposing the first area of the surface to light having a first wavelength while exposing the first area to a first etchant can include: illuminating only the first area of the surface to light having the first wavelength through patterned illumination. The exposing the second area of the surface to light having a second wavelength shorter than the first wavelength while exposing the second area to a second etchant can include: illuminating only the second area of the surface to light having the second wavelength through patterned illumination.

In some embodiments, the exposing the first area of the surface to light having a first wavelength while exposing the first area to a first etchant can include: depositing a first mask layer; and patterning an opening on the first mask layer, the opening corresponding to the first area. The exposing the second area of the surface to light having a second wavelength shorter than the first wavelength while exposing the second area to a second etchant can include: depositing a second mask layer; and patterning an opening on the second mask layer, the opening corresponding to the second area. The plurality of quantum dots and both the opening on the first mask layer and the opening on the second mask layer can be on opposite sides of the layer.

The first etchant and the second etchant can be liquids. The first etchant and the second etchant can include one or more of H2SO4, H2O2, H2O, HCL, C2H2O4, 4.5-dihydroxy-1.3-benzene disulfonic acid, hydro fluoric acid, tetrabutylammonium fluoroborate (TBABF4), KOH, H3PO4, or NaH2PO4. In some embodiments, the first etchant and the second etchant can further include oxidizing agents.

The first etchant and the second etchant can be gases. The first etchant and the second etchant can include one or more of Cl2, BCl3, SF6, CF4, CH4, CHF3, O2, H2, N2, Ar, or He. The forming the plurality of quantum dots, the exposing the first area, and the exposing the second area can be performed under vacuum without breaking the vacuum.

In some embodiments, the process can further include: prior to the exposing the first area of the surface to light having a first wavelength while exposing the first area to the first etchant, etching the quantum dots in the first and second areas to have an initial dimension at or greater than the first threshold dimension.

The processing the etched layer to form the LED device can include: forming a first anode corresponding to the first area; forming a second anode corresponding to the second area; and forming a shared cathode corresponding to both the first and second areas.

In some embodiments, the plurality of quantum dots can be a first plurality of quantum dots and the layer can be a first layer, and the process can further include: forming a second plurality of quantum dots on a surface of a second layer, the second layer and the first plurality of quantum dots arranged on opposite sides of the first layer; and exposing the surface of the second layer to light having a third wavelength equal to or shorter than the second wavelength while exposing the surface of the second layer to a third etchant that, due at least in part to an interaction between the light at the third wavelength and the quantum dots, etches the quantum dots on the surface of the second layer at a fifth etch rate while the quantum dots have a dimension at or greater than a third threshold dimension, and at a sixth etch rate while the quantum dots have a dimension less than the third threshold dimension, the fifth etch rate being higher than the sixth etch rate, wherein the second plurality of quantum dots are sized to emit light substantially within a third band of wavelengths shorter than the first and second bands of wavelengths.

The forming the plurality of quantum dots can include performing one of metal-organic chemical vapor deposition, molecular beam epitaxy, or liquid phase epitaxy.

The forming the plurality of quantum dots can include: forming a quantum well layer; and forming the plurality of quantum dots by etching the quantum well layer.

The plurality of quantum dots can include a light emitting material selected from the group consisting of Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

The second and fourth etch rates can be less than 5 nm/min.

In another aspect, the invention features an apparatus that includes a light emitting device produced using the process for producing a light emitting diode (LED) device. In some embodiments, the apparatus can be a display.

In a further aspect, the invention features a process for producing a light emitting diode (LED) device, the process including: forming a plurality of quantum dots on a surface of a layer including a first area and a second area, the forming of the plurality of quantum dots including: exposing the first area of the surface to light having a first wavelength while exposing the first area to a quantum dot forming environment that, due at least in part to an interaction between the light at the first wavelength and the quantum dots, causes the quantum dots in the first area to form at a first growth rate while the quantum dots have a dimension less than a first threshold dimension, and at a second growth rate while the quantum dots have a dimension at or greater than the first threshold dimension, the first growth rate being higher than the second growth rate; exposing the second area of the surface to light having a second wavelength longer than the first wavelength while exposing the second area to the quantum dot forming environment that, due at least in part to an interaction between the light at the second wavelength and the quantum dots, causes the quantum dots in the second area to form at a third growth rate while the quantum dots have a dimension less than a second threshold dimension, and at a fourth growth rate while the quantum dots have a dimension at or greater than the second threshold dimension, the second threshold dimension being larger than the first threshold dimension, and the third growth rate being higher than the fourth growth rate; and processing the layer to form the LED device, wherein the quantum dots in the first area are sized to emit light substantially within a first band of wavelengths and the quantum dots in the second area are sized to emit light substantially within a second band of wavelengths different from the first band of wavelengths.

Embodiments of the process can include one or more of the following features and/or features of other aspects. For example, the exposing the first area of the surface to light having a first wavelength while exposing the first area to a quantum dot forming environment can include: depositing a first mask layer; and patterning an opening on the first mask layer, the opening corresponding to the first area, and the exposing the second area of the surface to light having a second wavelength while exposing the first area to a quantum dot forming environment can include: depositing a second mask layer; and patterning an opening on the second mask layer, the opening corresponding to the second area.

In some embodiments, the exposing the first area of the surface to light having a first wavelength while exposing the first area to a quantum dot forming environment can include: illuminating only the first area of the surface to light having the first wavelength through patterned illumination. The exposing the second area of the surface to light having a second wavelength while exposing the first area to a quantum dot forming environment can include: illuminating only the second area of the surface to light having the second wavelength through patterned illumination.

The quantum dot forming environment can be a gaseous environment. The forming of the plurality of quantum dots can be performed under vacuum without breaking the vacuum.

The quantum dot forming environment can be a liquid environment.

In some embodiments, the forming a plurality of quantum dots on a surface of a layer including a first area and a second area can further include: prior to the exposing the first area of the surface to light having a first wavelength while exposing the first area to a quantum dot forming environment, forming the quantum dots in the first and second areas to have an initial dimension at or less than the first threshold dimension.

The light having the first wavelength and the light having the second wavelength can be monochromatic light.

The light having the first wavelength and the light have the second wavelength can be generated by a laser source.

The processing the layer to form the LED device can include: forming a first anode corresponding to the first area; forming a second anode corresponding to the second area; and forming a shared cathode corresponding to both the first and second areas.

In some embodiments, the plurality of quantum dots can be a first plurality of quantum dots and the layer can be a first layer, and the process can further include: forming a second plurality of quantum dots on a surface of a second layer, the second layer and the first plurality of quantum dots arranged on opposite sides of the first layer, by: exposing the surface of the second layer to light having a third wavelength equal to or shorter than the first wavelength while exposing the surface of the second layer to the quantum dot forming environment that, due at least in part to an interaction between the light at the third wavelength and the quantum dots, forms the quantum dots on the surface of the second layer at a fifth growth rate while the quantum dots have a dimension less than a third threshold dimension, and at a sixth growth rate while the quantum dots have a dimension at or greater than the third threshold dimension, the fifth growth rate being higher than the sixth growth rate, wherein the second plurality of quantum dots are sized to emit light substantially within a third band of wavelengths shorter than the first and second bands of wavelengths.

The forming of the plurality of quantum dots can include performing one of metal-organic chemical vapor deposition, molecular beam epitaxy, or liquid phase epitaxy.

The plurality of quantum dots can include a light emitting material selected from the group consisting of Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

The second and fourth growth rates can be less than 6 monolayers/minute.

In a further aspect, the invention features a light emitting diode (LED) device that includes: a base layer; a first quantum dot region supported by the base layer, the first quantum dot region comprising a first plurality of quantum dots having a first dimension; and a second quantum dot region supported by the base layer, the second quantum dot region comprising a second plurality of quantum dots having a second dimension different from the first dimension, wherein the first quantum dot region and the second quantum dot region are disposed on a common plane parallel to the base layer, and wherein the first quantum dot region and the second quantum dot region are non-overlapping regions.

Embodiments of the LED device can include one or more of the following features and/or features of other aspects. For example, the LED device can further include: a third quantum dot region supported by the base layer, the third quantum dot region including a third plurality of quantum dots having a third dimension different from the first and second dimensions, wherein during operation, the first plurality of quantum dots emits light substantially within a red band of wavelengths, the second plurality of quantum dots emit light substantially within a green band of wavelengths, and the third plurality of quantum dots emit light substantially within a third band of wavelengths.

In some embodiments, the third quantum dot region and both the first and second quantum dot regions can be on opposite sides of the base layer, wherein during operation, the light emitted by the third plurality of quantum dots optically pumps the first and second pluralities of quantum dots.

In some embodiments, the LED device can further include: a first anode corresponding to the first quantum dot region; a second anode corresponding to the second quantum dot region; and a shared cathode corresponding to both the first and second quantum dot regions.

Among other advantages, inorganic LEDs emitting at different wavelength can be monolithically integrated on a common substrate using the disclosed techniques. Emission wavelength of quantum dots can be modified to a desired wavelength by controlling an illumination wavelength of light used in the photoelectrochemical etching process. Number of required electrical contacts can be reduced by sharing a common N-contact across monolithically integrated ILEDs emitting at different wavelength bands. Footprint of ILEDs can be reduced due to sharing of the N-contact.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 1A shows an example of a photoelectrochemical etching system for controlling etching of quantum dots;

FIGS. 1B-1D show example emission/absorption spectra of quantum dots on different regions of the substrate in FIG. 1A prior to the PEC etch;

FIGS. 1E-1G show evolutions of the emission/absorption spectra of the quantum dots on different regions of the substrate during the PEC etching process;

FIG. 1H shows quantum dots with modified dimensions from the PEC etching of FIG. 1A;

FIG. 4A shows an example of a system for controlling growth of quantum dots through illumination;

FIGS. 4B-4D show example emission/absorption spectra of quantum dots on different regions of the substrate in FIG. 4A prior to illumination-controlled growth;

Like reference numbers and designations in the various drawings indicate like elements.

DETAILED DESCRIPTION

Figure 2A:
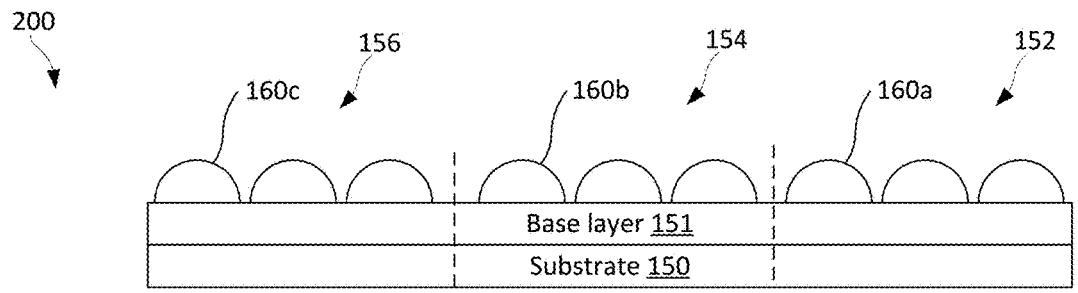
FIGS. 2A-2F show steps of a first example process for fabricating a multi-color monolithic LED.

Referring to FIG. 1A, an example of a photoelectrochemical (PEC) etching system 100 for controlling etching of quantum dots is shown. The PEC etching system 100 includes an etchant tank 110, a voltage source 120, a first illumination source 130, and a second illumination source 140. The tank 110 is filled with liquid etchant 112, and a substrate 150 containing the quantum dots 160 to be etched by the PEC etching system 100 is immersed in the etchant 112. The voltage source 120 is electrically coupled with a counter electrode 122 and the quantum dots 160, and applies a voltage across the etchant 112 and the quantum dots 160.

Quantum dots (QD) 160a-c, collectively referred to as quantum dots 160, are nanoparticles that typically range from 2 nm to 50 nm in size, in which quantum confinement of electrons or holes affect the emission and absorption wavelength of the constituent material. The dimensions of the quantum dots 160 and the center wavelength of the emission and absorption spectra are generally correlated, where a reduction in the dimensions results in a decrease in the center wavelength of the emission and absorption spectra, and vice versa. In the example of FIG. 1A, the quantum dots 160a-c are distributed across a first region 152, a second region 154, and a third region 156 of the substrate 150, respectively, and initially have a uniform dimension of $d_3$.

As the emission wavelengths of the quantum dots 160 are correlated with the dimensions of the quantum dots 160, independent control of the dimensions of the quantum dots on different regions of the substrate 150 can enable emission of a first wavelength $\lambda_1$ from the first region 152, a second wavelength $\lambda_2$ from the second region 154, and a third wavelength $\lambda_3$ from the third region 156. Such independent control over etching of the quantum dots 160 located at different regions of the substrate 150 can be achieved using the PEC etching technique.

PEC etching is a type of chemical etching of semiconductor materials assisted by illumination of the semiconductor being etched. A chemical etching process proceeds by sustaining a chemical reaction between the semiconductor and the etchant 112. Examples of various chemical reactions between the semiconductor and the etchant 112 includes oxidation and reduction of the semiconductor.

Oxidation reactions can be initiated by holes in the valence band of the semiconductor, and reduction reactions can be initiated by electrons in the conduction band of the semiconductor. In PEC etching, the electrons and/or holes necessary to drive the chemical reaction processes can be provided by illuminating the semiconductor with light having photon energies greater than the bandgap of the semiconductor. The illuminated light is absorbed by the semiconductor, generating electron-hole pairs that can drive the chemical reactions to sustain etching. At levels below absorption-saturation regime of the semiconductor, the generation rate of the electron-hole pairs is generally proportional to the intensity of the illuminated light. As such, intensity of the light can be used to control the etch rate of the PEC etching process. Furthermore, at a fixed intensity of the light, the absorption strength, or absorbance, of the semiconductor affect the amount of absorbed light, hence the amount of photo-generated electron-hole pairs.

The resulting chemical reaction forms a reaction product which may or may not be soluble in the etchant 112. The chemical etching can be sustained when the reaction product is soluble in the etchant 112, which dissolves the reaction product and continues the chemical reaction with newly exposed semiconductor beneath the now-dissolved layer of the reaction product. In cases where the initial reaction product is not soluble in the etchant 112, subsequent chemical reactions may be necessary to convert the non-soluble reaction product to a soluble reaction product. Such subsequent chemical reactions may be driven by the electron-hole pairs generated by photo-absorption of the illuminated light by the semiconductor.

Due to the PEC etching process being driven by the availability of photo-generated electron-hole pairs, light illumination can be used to control the PEC etching process. For example, the illumination can be turned on to begin the PEC etching process, and turned off to stop the PEC etching process. Furthermore, as the quantum dots 160 absorb light at a specific band of wavelengths corresponding to their dimensions, wavelength of the illuminated light can be controlled to provide an additional degree of control over the PEC etching of quantum dots 160.

Referring to FIGS. 1B-1D, example emission/absorption spectra of quantum dots 160a-c on different regions of the substrate 150 in FIG. 1A prior to the PEC etch are shown. FIGS. 1B-1D correspond to the third region 156, the second region 154, and the first region 152, respectively. The X-axes corresponds to wavelength $\lambda$, and the Y-axes correspond to relative magnitude of emission (E) and absorption (A) by the quantum dots 160. The emission/absorption spectrum of quantum dots 160 typically have a Gaussian shape with an associated center wavelength and a full-width at half maximum (FWHM) linewidth. As the quantum dots 160 across all three regions all have the same dimension $d_3$, their absorption spectra are each centered around a third wavelength $\lambda_3$ corresponding to the dimension $d_3$ of the quantum dots. In this example, the third wavelength $\lambda_3$ is the third target emission wavelength, and $\lambda_3$ is longer than the remaining first and second target emission wavelengths denoted $\lambda_1$ and $\lambda_2$.

Referring back to FIG. 1A, the first illumination source 130 generates first light 132 at the first illumination wavelength $\lambda_{1p}$ and the second illumination source 140 generates second light 142 at the second illumination wavelength $\lambda_{2p}$. The first light 132 illuminates the first region 152 of the substrate 150 and the second light 142 illuminates the second region 154. The third region 156 is not illuminated in this example. The PEC etching process is initiated by turning on the first and second illumination sources 130 and 140 to illuminate regions 152 and 154 of the substrate 150 and turning on the voltage source 120 and apply a bias voltage across the etchant 112 and the quantum dots 160.

Referring to FIGS. 1E-1G, evolutions of the emission/absorption spectra of the quantum dots 160a-c on different regions of the substrate 150 during the PEC etching process are shown. The X-axes corresponds to wavelength $\lambda$, and the Y-axes correspond to relative magnitude of emission (E) and absorption (A) by the quantum dots. Referring to FIG. 1E corresponding to the third region 156, the emission/absorption spectrum of the quantum dots 162 of the third region 156 remains substantially unchanged at wavelength $\lambda_3$ during the course of the PEC etching process, as the third region 156 does not get etched by the PEC etching process due to the region not being illuminated.

Referring to FIG. 1F corresponding to the second region 154, the emission/absorption spectrum of the quantum dots 160b of the second region 154 shifts during the PEC etching process, from the third wavelength $\lambda_3$ to the second wavelength $\lambda_2$. Initially, the quantum dots 160b each have a dimension $d_3$ that corresponds to the third wavelength $\lambda_3$. The second light 142 that illuminates the second region 154 is absorbed by the quantum dots 160b, which causes the quantum dots 160b to be etched.

Etching of the quantum dots 160b leads to a decrease in the dimensions of the quantum dots 160b, leading to a corresponding shift in their absorption spectrum toward the shorter wavelengths, e.g., towards $\lambda_2$, as indicated by the arrow. As the PEC etching process continues, the center of the absorption spectrum of the quantum dots 160b shifts past the wavelength $\lambda_{2p}$ of the second light 142, at which point the PEC etching of the quantum dots 160b begins to slow down. The PEC etching of the quantum dots 160b comes to a stop, or self-terminates, when the edge of the absorption spectrum of the quantum dots 160b moves past the wavelength $\lambda_{2p}$ of the second light 142, at which point the second light 142 is no longer absorbed by the quantum dots 160b and the photo-generation of the electron-hole pairs stop.

Similarly, referring to FIG. 1G corresponding to the first region 152, the emission/absorption spectrum of the quantum dots 160a of the first region 152 shifts during the PEC etching process, from the third wavelength $\lambda_3$ to the first wavelength $\lambda_1$. Initially, the quantum dots 160a have a dimension $d_3$ that corresponds to $\lambda_3$. The first light 132 that illuminates the first region 152 is absorbed by the quantum dots 160a, which causes the quantum dots 160a to be etched.

Etching of the quantum dots 160a leads to decrease in the dimensions of the quantum dots 160a, leading to a corresponding shift in their absorption spectrum toward the shorter wavelengths, e.g., towards $\lambda_1$, as indicated by the arrow. As the PEC etching process continues, the center of the absorption spectrum of the quantum dots 160a shifts past the wavelength $\lambda_{1p}$ of the first light 132, at which point the PEC etching of the quantum dots 160a begins to slow down. The PEC etching of the quantum dots 160a comes to a stop, or self-terminates, when the edge of the absorption spectrum of the quantum dots 160a moves past the wavelength $\lambda_{1p}$ of the first light 132, at which point the first light 132 is no longer absorbed by the quantum dots 160a and the photo-generation of the electron-hole pairs stop.

Referring to FIG. 1H, quantum dots 160a-c with modified dimensions from the PEC etching of FIG. 1A are shown. As a result of the spatial selectivity of the PEC etching achieved by selective illumination of the different regions of the substrate 150, the dimensions of the quantum dots 160a of the first region 152 have been reduced to $d_1$, and the dimensions of the quantum dots 160b of the second region 152 have been reduced to $d_2$. Additionally, due to the self-terminating nature of the PEC etch-based control of the dimensions of the quantum dots, final dimensions of the quantum dots can be accurately controlled and a tight spread in the dimensions of the quantum dots can be achieved.

Referring back to FIG. 1F, the illumination wavelength $\lambda_{2p}$ of the second light 142 is offset by $\Delta\lambda$ to the right of the target second wavelength $\lambda_2$ of the quantum dots 160b. For example, the offset $\Delta\lambda$ can be set such that the illumination wavelength $\lambda_{2p}$ of the second light 142 is set to be just past the edge of the absorption spectrum of the quantum dots 160b. This offset $\Delta\lambda$ between the target wavelength of the quantum dots 160b and the illumination wavelength $\lambda_{2p}$ can be determined from the shape of the absorption spectrum of the quantum dots 160. For example, for a Gaussian-shaped absorption spectrum, the offset can be calculated based on the FWHM (e.g., 0.5*FWHM, 1*FWHM, 1.5*FWHM, 2*FWHM, and 3*FWHM). As another example, the offset can be determined by calculating the wavelength at which the absorption is less than a certain percentage of the peak absorption at the center wavelength (e.g., 10%, 5%, 2%, 1%, and 0.5% of the peak absorbance).

As such, while an asymptotic case where PEC etching of the quantum dots 160 self-terminates has been described, in general, the PEC etching process can have a first etch rate while the quantum dots have a dimension at or greater than a threshold dimension, and at a second etch rate when the quantum dots have a dimension less than the threshold dimension. For example, the threshold dimension can be the dimension of the quantum dots 160 at which the center of the emission spectrum of the quantum dots 160 is located at the target emission wavelength. By setting the illumination wavelength to be at a certain offset $\Delta\lambda$ from the target emission wavelength, the absorption of the illuminated light by quantum dots 160 can be reduced to a sufficiently low level when the quantum dots 160 reach the threshold dimension. At this point, depending on the criteria used in setting the offset $\Delta\lambda$, the etch rate of the quantum dots 160 is reduced to the second etch rate that is lower than the first etch rate when the quantum dots have a dimension at or greater than the threshold dimension. For example, the second etch rate can be 5 nm/min or less, 4 nm/min or less, 2 nm/min or less, 1 nm/min or less, 0.5 nm/min or less, such as about 0.1 nm/min.

In general, the first etch rate and the second etch rate are not fixed rates, but can be ranges of etch rates. As the etch rate of the PEC etching process is affected by the amount of photo-generated carriers, which is in turn related to the amount of absorbed light, the etch rates can change as the dimensions of the quantum dots 160 change during the PEC etching process. As such, the first etch rate can have a range of etch rates that does not overlap with a range of etch rates for the second etch rate.

The control over PEC etching of the quantum dots 160 can be further improved by measuring a flow of current between the quantum dots 160 and the etchant 112. In some implementations, the voltage source 120 can be a sourcemeter capable of simultaneously outputting a voltage and measuring a current. Alternatively, an ammeter can be placed in series with the voltage source 120 to measure the current. As PEC etching is an electrochemical reaction that involves oxidation and/or reduction of the semiconductor material being etched, the current flow between the quantum dots 160 and the etchant 112 corresponds to the etch rate of the quantum dots 160. Furthermore, the total amount of charge flow between the quantum dots 160 and the etchant 112, which can be determined by integrating the current flow over the etching duration, corresponds to the total amount of material etched. In some implementations, the voltage source 120 can be a pulsed voltage source capable of outputting voltages pulses. Pulsing of voltage may be used to modify characteristics of the PEC etching process.

As the measured current flow indicates the etch rate of the quantum dots 160, the current flow can be compared against a threshold current to determine when to stop the PEC etching process such that the target dimension, and hence the target emission wavelength, of the quantum dots 160 is achieved. The threshold current can be set, for example, as a fixed value. For example, the threshold current can be 1 µA, 2 µA, 5 µA, 10 µA, 20 µA, 50 µA, and 100 µA. Alternatively, the threshold current can be set as a percentage relative to the peak current flow measured during the PEC etching process. For example, the peak current may correspond to the etch rate when the center of the absorption spectrum of the quantum dots 160 being etched reaches the illumination wavelength, after which the etch rate, and hence the current flow, will decrease due to the shifting of the absorption spectrum past the illumination wavelength. As such, the relative definition of the threshold current may be more robust against various sources of process variation in the PEC etching process. Examples of sources of process variation can include temperature, etchant condition, density of quantum dots, area of the substrate, and illumination intensity. Furthermore, in some cases, the threshold current can be a threshold current density normalized relative to the area of counter electrode 122 or the substrate 150.

Additionally, or alternatively, photoluminescence from the quantum dots under illumination can be used to monitor the progress of the PEC etching. For example, when the quantum dots 160 absorb the illuminated light, the quantum dots 160 may emit light in response as photoluminescence. This magnitude of photoluminescence, for example, can be used as an indication of whether the illumination is being absorbed by the quantum dots 160. As such, PEC etching of the quantum dots 160 can be terminated, for example, when the magnitude of photoluminescence falls below a threshold value.

The first and second illumination sources 130 and 140 can be, for example, fixed-wavelength laser sources, tunable laser sources, pulsed laser sources. The narrow linewidth (e.g., 0.1 nm, 1 nm) of the light generates by such laser sources may be advantageous in achieving a tight distribution in dimensions of the PEC-etched quantum dots 160. While two illumination sources 130 and 140 have been described, in general, the PEC etching process can be performed with a single tunable illumination source. In such cases, PEC etching of different regions of the substrate 150 can be performed sequentially by sequentially illuminating the different regions.

Depending on the shape of the absorption spectrum of the quantum dots 160 and the amount of wavelength shifting of the quantum dots to be performed, it may be necessary to tune the wavelength of the first light 132 and/or the second light 142 during the PEC etching process. For example, when the wavelength of the first light 132 is significantly shorter than the center of the absorption spectrum of the quantum dots 160a such that falls outside of the absorption spectrum, the wavelength of the first light 132 can be shifted to overlap with the absorption spectrum to initiate the PEC etching process. The wavelength of the first light 132 can then be shifted toward the final wavelength as the etch progresses until the illumination wavelength reaches the wavelength $\lambda_{1p}$ corresponding to the target wavelength $\lambda_1$ of the quantum dots 160a. At this point, the illumination wavelength can remain fixed at $\lambda_{1p}$, and the PEC etching process can proceed to completion. Alternatively, in some implementations, the first light 132 can be a broadband light having wavelengths spanning from $\lambda 1_p$ to $\lambda 3$ or beyond. Such broadband illumination with a sharp cutoff at $\lambda 1_p$ can be used to enable etching of quantum dots 160a with absorption spectra that might otherwise fall outside of a narrowband first light 132. Such broadband light can be generated, for example, using a broadband light source followed by an optical high-pass filter or band-pass filter. As another example, a broadband light for such purpose can be approximated by combining multiple wavelengths, such as combining $\lambda 3$, $\lambda 2$, and $\lambda 1_p$ to provide overlap between the first light 132 and the absorption spectrum of the quantum dots 160a throughout the PEC etching process.

While emission spectrum and absorption spectrum of the quantum dots have been described to be equal in shape and wavelength, in general, the two spectra can be different in shape and/or center wavelength. For example, for some materials, quantum dot dimension, or combination thereof, the absorption spectrum can be asymmetric with an extended tail toward the shorter wavelengths. In such cases, PEC etching may be performed with a fixed-wavelength illumination even for wavelengths that would otherwise fall outside of a Gaussian-shaped absorption spectrum. Furthermore, in some cases, the center of the emission spectrum and the center of the absorption spectrum may be separated by an offset wavelength. In such cases, the offset wavelength can be taken into account (e.g., in determining the illumination wavelength) in the PEC etching process such that the final dimensions of the quantum dots 160 after the PEC etching process correspond to the target emission wavelength.

The etchant 112 can include various chemistries suitable for etching of various semiconductors. Furthermore, the various chemistries can be mixed in various proportions to achieve desired etching characteristics. For example, for PEC etching of GaAs, a mixture of $H_2SO_4$, $H_2O_2$, and $H_2O$ may be used in ratio of 1:1:25-100, respectively. As another example, for PEC etching of AlGaAs, a mixture of HCL and $H_2O$ may be used in ratio of 1:20, respectively. As yet another example, for PEC etching of InGaN and GaN, a 0.2M solution of $H_2SO_4$ may be used. As yet another example, for PEC etching of AlGaInN, oxalic acid ($C_2H2O_4$) may be used. Other examples of chemistries include 4.5-dihydroxy-1.3-benzene disulfonic acid, hydro fluoric acid, tetrabutylammonium fluoroborate (TBABF4), KOH, $H_3PO4$, and NaH2PO4.

The counter electrode 122 can be formed from various conductive material compatible with the chemistry of the etchant 112. Examples of materials for the counter electrode 122 include platinum and gold. Additionally, in some implementations, a reference electrode can be used to provide a reference potential that can be used in accurately applying the voltage across the quantum dots 160 and the etchant 112. Examples of the reference electrode include silver/silver chloride electrode and saturated calomel electrode.

While a voltage has been applied across the etchant 112 and the quantum dots 160 in the described example, in some implementations, PEC etching can be performed without applying an external voltage. Such PEC etching process are referred to as "electroless process". In an electroless PEC etching process, the application of voltage across the etchant 112 and the quantum dots 160 may be replaced with an oxidizing agent dissolved in the etchant 112.

Referring to FIGS. 2A-2F, steps of a first example process 200 for fabricating a multi-color monolithic LED is shown. Specifically, referring to FIG. 2A, the quantum dots 160 are formed on a base layer 151 supported by the substrate 150. Quantum dots 160 are typically formed from material capable of emitting light, such as semiconductors having a direct bandgap. Such semiconductor materials typically require a high degree of crystallinity to function as an effective light emitting material. Examples of deposition techniques suitable for deposition of crystalline semiconductor materials and quantum dots 160 include metal-organic chemical vapor deposition (MOCVD), molecular beam epitaxy (MBE), and liquid phase epitaxy (LPE).

Forming a layer of quantum dots typically requires a base layer 151 with lattice parameters suitable for the material being deposited, such that the quantum dot material and the base layer 151 are lattice-matched. For example, the substrate 150 can be a sapphire substrate, which is formed of crystalline aluminum oxide. While the sapphire substrate is crystalline, its lattice constant is not equal to, for example, InGaN being deposited to form the quantum dot. As direct deposition of the InGaN material on the sapphire substrate 150 leads to crystalline defects and consequently poor light emitting performance by the deposited InGaN quantum dots 160, the base layer 151 can serve as a buffer layer that serves to smooth the lattice mismatch between the substrate 150 and the quantum dots 160. The base layer 151 can also include a charge injection layer that can facilitate injection of electrons or holes into the quantum dots 160 formed above to generate light.

In some implementations, the quantum dots 160 may be formed spontaneously. For example, by controlling the deposition condition during the formation of the quantum dots, quantum dot 160 may be formed through various mechanisms such as self-assembly or nucleation as a direct product of the deposition process.

In some implementations, the quantum dots 160 may be formed by further processing a deposited layer. For example, a continuous layer of quantum well is formed using the foregoing deposition techniques, which is then patterned through photolithography and etched into small islands of quantum well, forming the quantum dots 160. The etching process, for example, can be a PEC etching process, or conventional wet or dry etching processes. As another example, the continuous layer of quantum well can be etched without a patterning step, and non-uniformity of the film and/or the etching process can be used to form the quantum dots 160.

In general, different light-emitting materials have various ranges of wavelengths over which they can emit light. As such, different light-emitting materials for forming the quantum dots 160 can be chosen based on a desired emission wavelength. Examples of various semiconductors capable of emitting light include Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

Figure 2B:
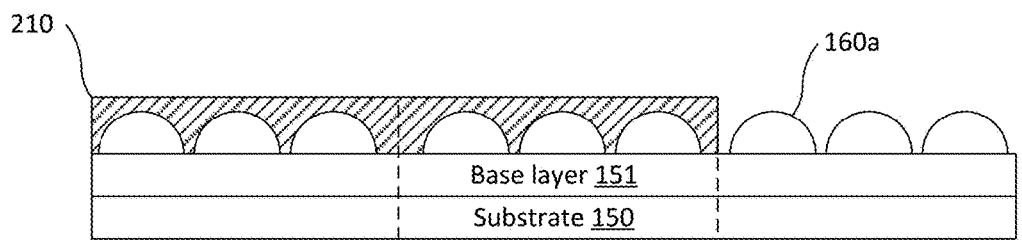

Suitable material for the substrate 150 can be chosen based on the material of the quantum dots 160. Examples of the material for the substrate include sapphire, silicon, silicon carbide, and various compound semiconductors such as AlN, GaN, GaAs, and InP. In cases where the lattice constants of the substrate and the quantum dot material are sufficiently similar, the buffer layer can be omitted. Referring to FIG. 2B, a first mask layer 210 is formed over the second and third regions 154 and 156. For example, a blanket film deposition followed by a patterning step, such as an lithography step and selective etching of the film against the quantum dots 160, can be used to form the first mask layer 210 that has an opening that corresponds to the first region 152. The first mask layer 210 serves to cover the quantum dots 160b-c of the second and third regions 154 and 156 from light and/or etchant during the following PEC etching step. As such, the first mask layer 210 is preferably resistant to the etchant 112 used in the PEC etching process in presence of illumination, and able to be removed selective against the quantum dots 160. Example of materials suitable for forming the first mask layer 210 include photoresist, dielectrics (e.g., $SiO_2$, SiN, and spin-on glass), polyimide, and metals resistant to etching by the etching chemistry (e.g., Au and Pt).

Figure 2C:
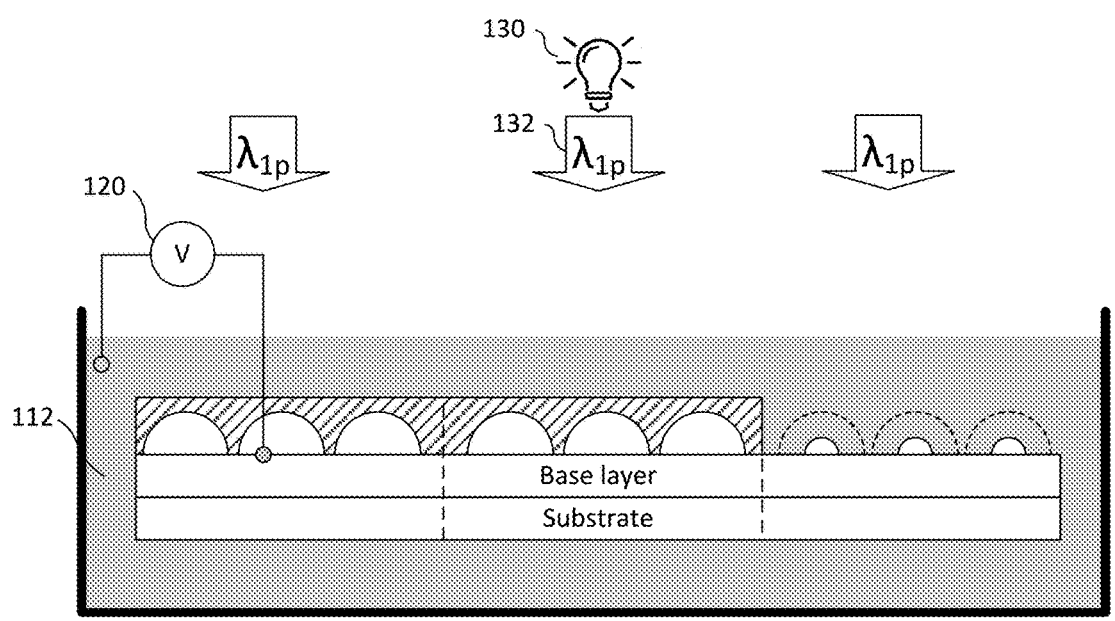

Referring to FIG. 2C, a first PEC etching step is performed. For example, the first PEC etching step involves immersing the substrate 150 in the etchant 112 and illuminating it with the first light 132. The quantum dots 160*a* of the first region 152 are illuminated with the first light 132 while being exposed to the etchant 112, leading to PEC etching of the quantum dots 160*a*. However, the first mask layer 210 blocks the etchant 112 from coming in contact with the quantum dots 160*b* and 160*c* of the second and third regions 154 and 156. As such, the quantum dots 160*b* and 160*c* are not etched during this PEC etching step. Additionally or alternatively, for first mask layer 210 that is opaque to the first light 132, the quantum dots 160*b* and 160*c* are further shielded from the PEC etching due to their lack of exposure to the first light 132. The first PEC etching step is completed when the quantum dots 160*a* of the first region 152 have reached their target dimension (e.g., $d_1$), at which point the first light 132 can be turned off to stop any further etching. The substrate 150 is removed from the etchant 112, and the first mask layer 210 is removed.

Figure 2D:
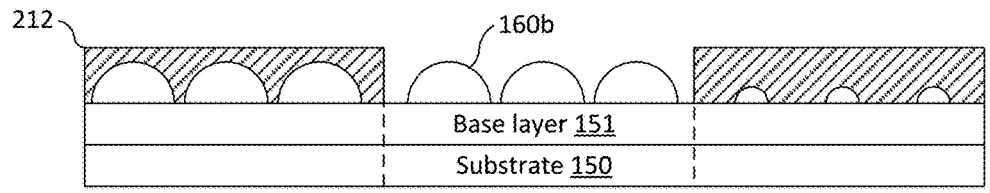

Referring to FIG. 2D, a second mask layer 212 is formed over the first and third regions 152 and 156. The second mask layer 212 can be formed in a manner analogous to the description of FIG. 2B, and similarly, the second mask layer 212 serves to cover the quantum dots 160*a* and 160*c* of the first and third regions 152 and 156 from the etchant 112 and/or light during the following PEC etching step.

Figure 2E:
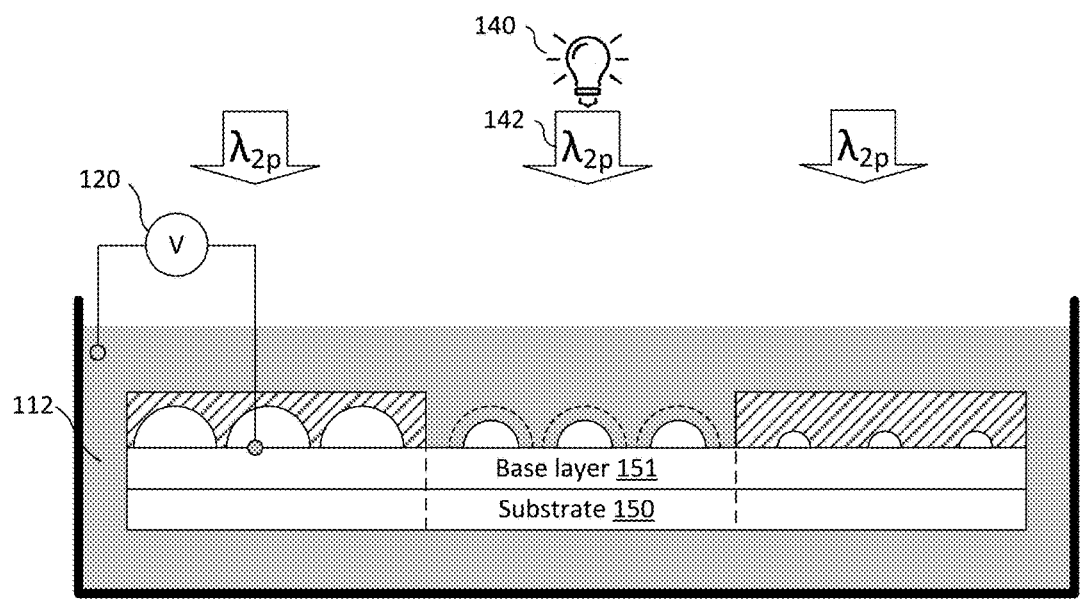

Referring to FIG. 2E, a second PEC etching step is performed. The second PEC etching step can be performed in a manner analogous to the description of FIG. 2C. At the conclusion of the second PEC etching step, the quantum dots 160*b* of the second region 154 have reached their target dimension (e.g., $d_2$).

Figure 2F:
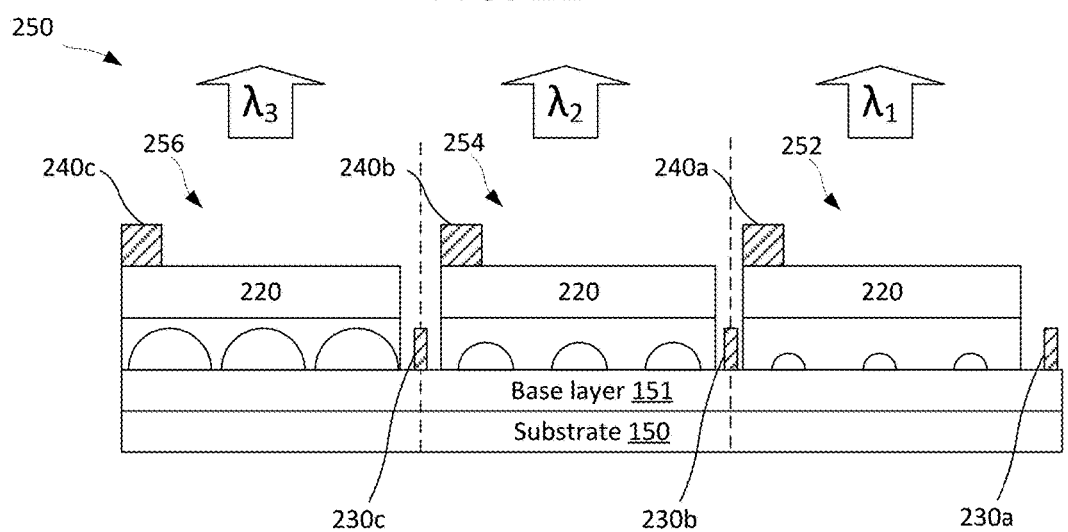

Referring to FIG. 2F, the etched layer of quantum dots 160 having 3 different dimensions are further processed to form a multi-color monolithic LED device 250. Additional processing to form the devices 250 can include, for example, an epitaxial regrowth step, and deposition of an organic carrier transport layer (e.g., hole transport layer, electron transport layer) to form a second carrier injection layer 220 on top of the quantum dots 160. Etching of the carrier injection layer 220 can be performed to electrically separate the different regions 152, 154, and 156. Cathodes 230*a-c* can be formed to establish respective electrical connections with the quantum dots 160*a-c* of the respective regions. For example, the cathodes 230*a-c* can be electrically coupled with the carrier injection layer included in the base layer 151, which are in electrical contact with the quantum dots 160. Anodes 240*a-c* can be formed to establish respective electrical connections with the quantum dots 160*a-c* of the respective regions. In some implementations, the cathodes 230*a-c* form a shared cathode that is shared among the different regions.

The resulting multi-color monolithic LED device 250 includes first, second, and third sub-pixels 252, 254, and 256 that can be individually addressed, or powered, using the anodes 240*a-c* and the cathodes 230*a-c*, respectively. For example, the first sub-pixel 252 can be a blue sub-pixel emitting blue light at wavelength $\lambda_1$, the second sub-pixels 254 can be a green sub-pixel emitting green light at wavelength $\lambda_2$, and the third sub-pixel 256 can be a red sub-pixel emitting red light at wavelength $\lambda_3$. By controlling the relative amount of light emitted by the sub-pixels, the LED device 250 can emit light of different colors, which can be used, for example, as a tunable-color LED lamp, or as a color pixel of a color LED display. In some implementations, the cathodes 230*a-c* can be shared among the sub-pixels 252, 254, and 256, which can reduce the total number of independent electrical contacts from 6 to 4, which can be beneficial in applications where minimizing the number of electrical contacts is beneficial. For example, in case of a microLED, due to the extremely small footprint possible with such devices, the minimum achievable footprint of the microLED device may be determined by the minimum size of the electrical contacts. In such applications, reducing the number of electrical contacts can lead to further reduction in size of the microLED device, resulting in more compact and potentially cheaper devices.

While fabrication of a single multi-color monolithic LED device 250 using the process 200 has been described, the process 200 can be used to fabricate an LED display that includes an array of devices 250, each corresponding to a pixel of the LED display. For example, an array of the LED device 250 can be monolithically integrated on the substrate 150 by fabricating a plurality of devices 250 in parallel using the process 200.

While an example where the first and second mask layers 210 and 212 are directly covering the quantum dots has been described, in some implementations, the first and second mask layers 210 and 212 can be formed on the backside of the substrate 150 opposite to the quantum dots 160. In some cases, the material forming the first and second mask layers 210 and 212 can be difficult to remove, or the removal process can negatively affect the quantum dots 160. For example, due to incomplete selectivity of the mask removal process, the quantum dots 160 can be attacked during the mask removal process, reducing the performance of the quantum dots 160. Additionally, or alternatively, residue of the mask layers even at the atomic scale can cause a reduction in performance of the quantum dots 160. Such problems can be circumvented by forming the mask layers on the backside of the substrate. In cases where the substrate 150 and the base layer 151 is sufficiently transparent to the illumination to allow sufficient amount of the first and second lights 132 and 142 to reach the quantum dots 160 through them, illumination of the quantum dots 160 during the PEC etching process through the backside of the substrate 150 can enable spatially-selective PEC etching without physically masking the quantum dots 160.

As an alternative to use of the masking layers 210 and 212, in some implementations, patterned illumination can be used to selectively expose different regions of the substrate to the illumination. For example, a photomask containing an image of a desired spatially-varying illumination pattern can be used to project the desired spatially-varying illumination pattern onto the substrate in a manner analogous to photolithography. Additionally, various alignment techniques used in alignment of photolithographic layers to the substrate can be used to align the illumination patterns across different PEC etching steps of the same substrate to form the multi-color monolithic LED device 250.

While anodes 240*a-c* and cathodes 230*a-c* have been described, in some implementations, the polarity of these electrical terminals can be reversed. For example, the anodes 240*a-c* may be cathodes 240*a-c*, and the cathodes 230*a-c* may be anodes 240*a-c*.

Figure 3A:
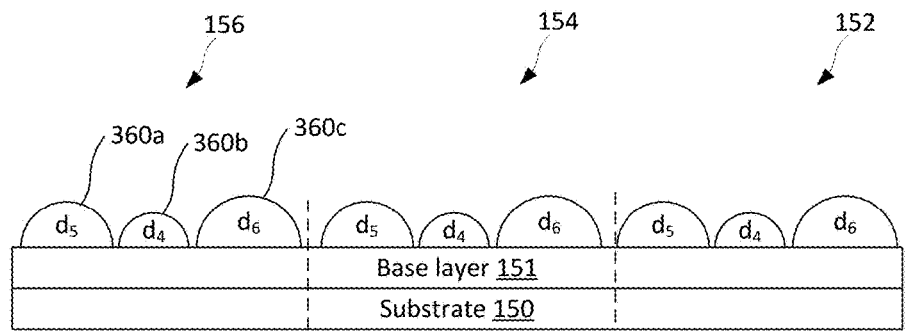
FIGS. 3A-3B show another step for fabricating a multi-color monolithic LED.
Figure 3B:
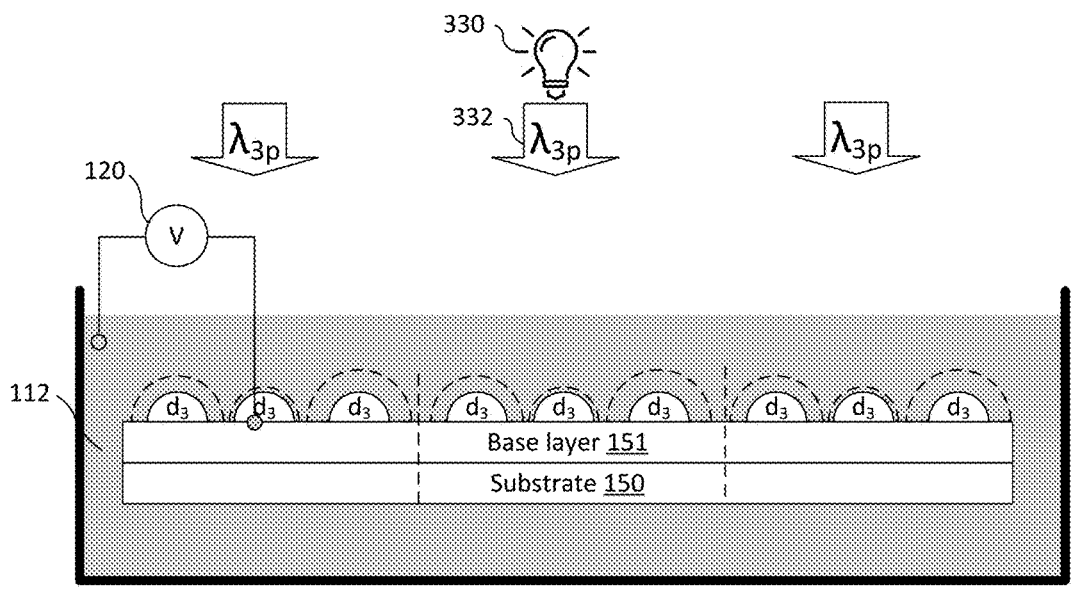

Referring to FIGS. 3A-3B, another step for fabricating a multi-color monolithic LED is shown. Typically, quantum dots are grown in a single forming step to have a dimension greater than the largest target dimension of the quantum dots corresponding to the longest target emission wavelength. Furthermore, while the dimensions of the quantum dots 160 prior to PEC etching steps have been illustrated as having a uniform dimension $d_3$, referring to FIG. 3A, the quantum dots 360*a-c* as formed by various deposition techniques typically have a distribution of dimensions that are larger than the largest target dimension. For example, due to factors such as process variation and deposition non-uniformity, quantum dots 360a-c can have different dimensions $d_4$ through $d_6$, respectively. The dimensions $d_4$ through $d_6$ are larger than the largest of the target dimension (e.g., $d_3$ of FIG. 1H).

Referring to FIG. 3B, a blanket PEC etching step of all regions of the substrate 150 is performed. An illumination source 330 is used to generate light 332 to drive the PEC etching of the quantum dots 360. The wavelength of the light 332, for example, can be $\lambda_{3p}$, which is set to etch the quantum dots 360 to the largest target dimension $d_3$. Due to the self-terminating nature of the PEC etching step, the quantum dots 360a-c are etched down until they all reach the target dimension $d_3$, at which point the blanket PEC etching step is terminated.

Performing the blanket PEC etching step of all regions 152, 154, and 156 of the substrate can reduce the durations of subsequent PEC etching steps for the remaining regions over individual etching of the different regions. Additionally, the initial dimensional non-uniformity of the quantum dots 360a-c from the deposition process can be reduced by the blanket etching step, which can improve process uniformity of the subsequent processing steps.

The process step described in relation to FIG. 3B can be used as a part of the process for fabrication of multi-color LEDs, as well as an independent step in fabrication process for a single-color LED. Use of the process step of FIG. 3B can lead to improvement in uniformity of the dimensions of the quantum dots 360, which can improve the color uniformity of the resulting single-color LED fabricated from the quantum dots 360.

While PEC etching of the quantum dots using a liquid etchant 112 has been described, PEC etching may also be performed with gas-phase etchants in an analogous manner. Examples of chemistries for gas-phase etchant include various mixtures of $Cl_2$, $BCl_3$, $SF_6$, $CF_4$, $CH_4$, $CHF_3$, $O_2$, $H_2$, $N_2$, Ar, and He.

Use of gas-phase PEC etching can enable deposition of the quantum dots followed by PEC etching of the quantum dots without the substrate leaving the vacuum environment. For example, both the deposition and PEC etching of the quantum dots can be performed in a single vacuum chamber. Alternatively, the deposition and etching can each be performed on dedicated deposition and etching chambers connected by a transfer chamber that enable transfer of the substrate without leaving vacuum. The gas-phase PEC etching of different regions of the substrate can be performed without masking layers by using patterned illumination. Processing of the quantum dots from deposition through PEC etching through epitaxial regrowth without the quantum dots being exposed to atmosphere may improve performance of the quantum dots.

Furthermore, in some implementations, subtractive dimensional control may be performed in a vacuum environment or in an environment similar to a quantum dot forming environment in which the quantum dots were grown. For example, photo-enhanced thermal desorption process during, or after the deposition of the quantum dots may be used in modifying the dimensions of the quantum dots.

Up to this point, post-deposition control of the dimensions of the quantum dots using the PEC etching techniques has been described. Now, techniques for controlling the dimensions of the quantum dots during their growth process will be described. Referring to FIG. 4A, a system 400 for controlling growth of quantum dots 460 through illumination is shown. The system 400 includes a quantum dot forming environment 410, a first illumination source 420, a second illumination source 430, and a third illumination source 440. The substrate having different regions 152, 154, and 156 is immersed in the quantum dot forming environment 410.

The quantum dot forming environment 410 deposits quantum dots 460a-c, collectively referred to as quantum dots 460, onto the substrate 150. In this example, quantum dots 460 are being deposited in the forming environment, and the quantum dots 460 have a uniform dimension of $d_0$ at a particular time during the deposition process. As previously described, a base layer may be present on the substrate 150 to facilitate formation of quantum dots 460 on the substrate 150.

The forming environment 410 is generally a gaseous or liquid environment containing the various chemical precursors and/or constituent materials used in forming the quantum dots 460. For example, when depositing the quantum dot 460 through MBE, the forming environment 410 can be a mixture of physical vapor of the constituent material of the quantum dots, such as indium, gallium, and nitrogen when depositing an InGaN quantum dot. As another example, when depositing the quantum dot 460 through MOCVD, the forming environment 410 can be a mixture of various chemical precursors, such as tri-methyl-indium (TMI), tri-methyl-gallium (TMG), ammonia, and nitrogen when depositing an InGaN quantum dot. As yet another example, when depositing the quantum dot 460 through LPE, the forming environment 410 can be molten liquid of the constituent material of the quantum dots, such as liquid-phase gallium nitride for depositing a GaN quantum dot.

The first, second, and third illumination sources 420, 430, and 440 can be, for example, fixed-wavelength laser sources, tunable laser sources, and pulsed laser sources. The narrow linewidth (e.g., 0.1 nm, 1 nm) of the light generates by such laser sources may be advantageous in achieving a tight distribution in dimensions of the illumination-controlled growth of the quantum dots 460. While three illumination sources 420, 430 and 440 have been described, in general, the illumination-controlled growth process can be performed with a single tunable illumination source. In such cases, illumination-controlled growth of different regions of the substrate 150 can be performed sequentially by sequentially illuminating the different regions.

In general, deposition, or growth, of a layer of material on a surface is governed at least in part by a balance of adsorption and desorption. Adsorption is the adhesion of atoms, ions, or molecules from gas, liquid, or dissolved solid onto a surface. Desorption is the reverse phenomenon of adsorption, resulting in a release of the atoms, ions or molecules from the surface. At a given moment, a surface can simultaneously experience both adsorption and desorption, where material is deposited when the rate of adsorption is greater than the rate of desorption, and removed when the relationship is reversed.

In case of the deposition of the quantum dots 460, the presence of photo-generated carriers can affect the balance between adsorption and desorption. When the quantum dots 460 absorb illuminated light and electron-hole pairs are generated as a result, the presence of the electrons and holes can decrease the adsorption rate, increase the desorption rate, or combination thereof, leading to a decrease in growth rate or a complete stop in further growth when the rate of adsorption is matched by the rate of desorption. For example, in case of MOCVD, the combination of electron and holes at the surface can modify the rates of various chemical reactions by the chemical precursors that take place at the surface of the quantum dots. As the reaction products of the chemical precursors are adsorbed by the surface in forming the quantum dots, changing the rates of chemical reactions of the MOCVD process can lead to a change in the growth rate of the quantum dots 460. This phenomenon of illumination-controlled growth rate of the quantum dots 460 can be used in controlling the size of the quantum dots 460 during their growth.

Typically, growth of larger quantum dots leads to more strain and/or defects, which can adversely affect the performance of the quantum dots. Once the defects have been formed, etching of the quantum dots to reduce their dimension typically does not fully remove the created defects. As such, a controlled growth of the quantum dots to the desired dimension can lead to growth of quantum dots with lower number of defects, which can lead to improved performance of the quantum dots.

Referring to FIGS. 4B-4D, example emission/absorption spectra of quantum dots on different regions of the substrate in FIG. 4A prior to illumination-controlled growth are shown. FIGS. 4B-4D correspond to the third region 156, the second region 154, and the first region 152, respectively. The X-axes corresponds to wavelength $\lambda$, and the Y-axes correspond to relative magnitude of emission (E) and absorption (A) by the quantum dots 460. The emission/absorption spectrum of quantum dots 460 typically have a Gaussian shape with an associated center wavelength and a full-width at half maximum (FWHM) linewidth. As the quantum dots 460 across all three regions all have the same initial dimension $d_0$, their absorption spectra are each centered around an initial wavelength $\lambda_0$ corresponding to the dimension $d_0$ of the quantum dots. In this example, the initial wavelength $\lambda_0$ are shorter than the target emission wavelengths denoted $\lambda_1$, $\lambda_2$, and $\lambda_3$.

Referring back to FIG. 4A, the first illumination source 420 generates first light 422 at the first illumination wavelength $\lambda_{1p}$, the second illumination source 430 generates second light 432 at the second illumination wavelength $\lambda_{1p}$, and the third illumination source 440 generates third light 442 at the third illumination wavelength $\lambda_{3p}$. The first, second and third light 422, 432, and 442 illuminate the first, second, and third regions 152, 154, and 156 of the substrate 150, respectively. The illumination of the quantum dots 460a-c does not affect the deposition process at this time as the quantum dots 460a-c do not absorb the illuminated light due to the respective absorption spectra not overlapping with the respective illumination wavelengths.

Figure 4E:
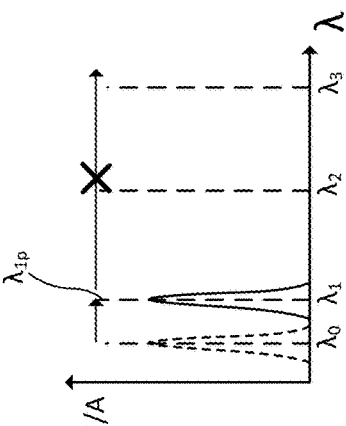
FIGS. 4E-4G show evolutions of the emission/absorption spectra of the quantum dots on different regions of the substrate during the illumination-controlled growth.
Figure 4F:
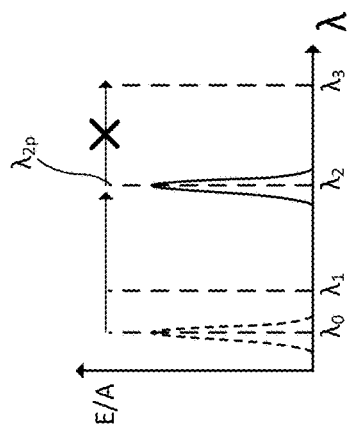
Figure 4G:
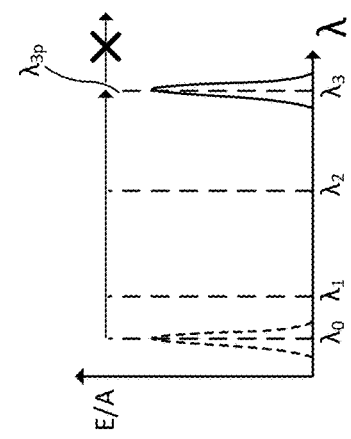

Referring to FIGS. 4E-4G, evolutions of the emission/absorption spectra of the quantum dots 460a-c on different regions of the substrate 150 during the illumination-controlled growth are shown. The X-axes corresponds to wavelength $\lambda$, and the Y-axes correspond to relative magnitude of emission (E) and absorption (A) by the quantum dots. Referring to FIG. 4E corresponding to the third region 156, the emission/absorption spectrum of the quantum dots 460c of the third region 156 shifts during the growth process, from the initial wavelength $\lambda_0$ to the third wavelength $\lambda_3$ as marked by the arrow. Initially, the quantum dots 460a each have a dimension $d_0$, at which the corresponding absorption spectrum do not overlap with the illumination wavelength $\lambda_3p$ that corresponds to the third wavelength $\lambda_3$. As such, the third light 442 illuminating the third region 156 is not absorbed by the quantum dots 460c, and the quantum dots 460c continue to grow in dimension. Eventually, the growth of the quantum dots 460c causes their absorption spectrum to overlap with the illumination wavelength $\lambda_{3p}$ of the third light 442, at which point the third light 442 begins to be absorbed in increasing amounts, generating an increasing number of electron-hole pairs. In this example, the balance between the rate of adsorption and the rate of desorption reaches an equilibrium when the center of the absorption spectrum coincides with the illumination wavelength $\lambda_{3p}$. As a result, the quantum dots 460c stops growing at this point and does not grow any further, as indicated by the crossed out arrow.

Similarly, referring to FIGS. 4F and 4G, the quantum dots 460b grows until the center of their absorption spectrum reaches the illumination wavelength $\lambda_{2p}$ of the second light 432, and the quantum dots 460a grows until the center of their absorption spectrum reaches the illumination wavelength $\lambda_{1p}$ of the first light 422, at which point the quantum dots 460a-c have reached their respective target dimensions, and the growth process is completed.

Figure 4H:
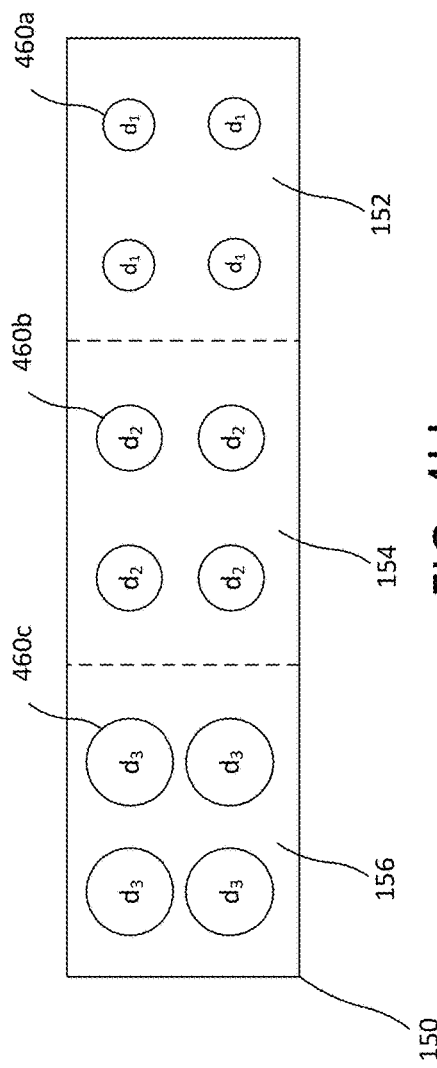
FIG. 4H shows quantum dots with controlled dimensions from the illumination-controlled growth of FIG. 4A.

Referring to FIG. 4H, quantum dots 460a-c with controlled dimensions from the illumination-controlled growth of FIG. 4A is shown. As a result of the spatial selectivity of the illumination-controlled growth process achieved by selective illumination of the different regions of the substrate 150, the dimensions of the quantum dots 460a of the first region 152 have grown to $d_1$, the dimensions of the quantum dots 160b of the second region 152 have grown to $d_2$, and the dimensions of the quantum dots 160c of the third region 156 have grown to $d_3$. Due to the self-terminating nature of the illumination-controlled growth, final dimensions of the quantum dots can be accurately controlled and a tight spread in the dimensions of the quantum dots can be achieved.

In some implementations, monitoring photoluminescence from the quantum dots under illumination can be used to monitor the progress of the growth of the quantum dots. For example, when the quantum dots 460 absorb the illuminated light, the quantum dots 160 may emit light in response as photoluminescence. This magnitude of photoluminescence, for example, can be used as an indication of whether the illumination is being absorbed by the quantum dots 160. As such, growth of the quantum dots 160 can be terminated for example, when the magnitude of photoluminescence reaches a threshold value.

While an asymptotic case where illumination-controlled growth of the quantum dots 460 self-terminates has been described, in general, the illumination-controlled growth process can have a first growth rate while the quantum dots have a dimension less than a threshold dimension, and at a second growth rate when the quantum dots have a dimension at or greater than the threshold dimension. For example, the threshold dimension can be the dimension of the quantum dots 460 at which the center of the emission spectrum of the quantum dots 460 is located at the target emission wavelength. By setting the illumination wavelength to be at a certain offset $\Delta\lambda$ from the target emission wavelength, the absorption of the illuminated light by quantum dots 460 can be increased to a sufficient level when the quantum dots 460 reach the threshold dimension. At this point, depending on the criteria used in setting the offset $\Delta\lambda$, the growth rate of the quantum dots 460 is reduced to the second growth rate that is lower than the first growth rate when the quantum dots have a dimension less than the threshold dimension. For example, the second growth rate can be 5 nm/min or less, 4 nm/min or less, 2 nm/min or less, 1 nm/min or less, 0.5 nm/min or less, such as about 0.1 nm/min. As another example, the second growth rate can be 6 monolayers/min or less, 5 monolayers/min or less, 4 monolayers/min or less, 3 monolayers/min or less, 2 monolayers/min or less, such as about 1 monolayers/min.

In general, the first growth rate and the second growth rate are not fixed rates, but can be ranges of growth rates. As the growth rate of the illumination-controlled growth process is affected by the amount of photo-generated carriers, which are in turn related to the amount of absorbed light, the growth rates can change as the dimensions of the quantum dots 460 change during the illumination-controlled growth process. As such, the first growth rate can have a range of growth rates that does not overlap with a range of growth rates for the second growth rate.

Referring to FIGS. 5A-5E, steps of a second example process 500 for fabricating a multi-color monolithic LED is shown. Specifically, referring to FIG. 5A, a first mask layer 510 is formed over the first and second regions 152 and 154. The first mask layer 510 can be formed as described in relation to FIG. 2B. In this example, the quantum dots 460a-c have been initially grown to have dimension $d_1$ corresponding to the first target emission wavelength $\lambda_1$ prior to selective growth of different regions. The initial growth can be performed using the illumination-controlled growth technique. As growth rates of quantum dots 460 are typically low, a common growth step across the different regions can lead to a reduction in total growth time and improved process throughput. However, in general, the quantum dots of different regions can be grown from scratch without performing a shared growth step.

Figure 5A:
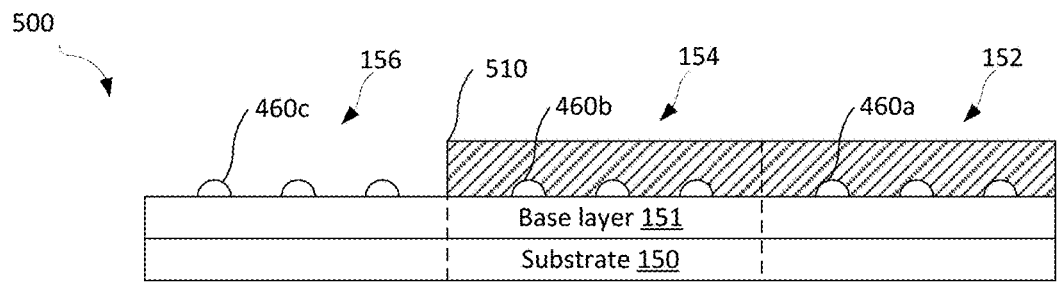
FIGS. 5A-5E show steps of a second example process for fabricating a multi-color monolithic LED.
Figure 5B:
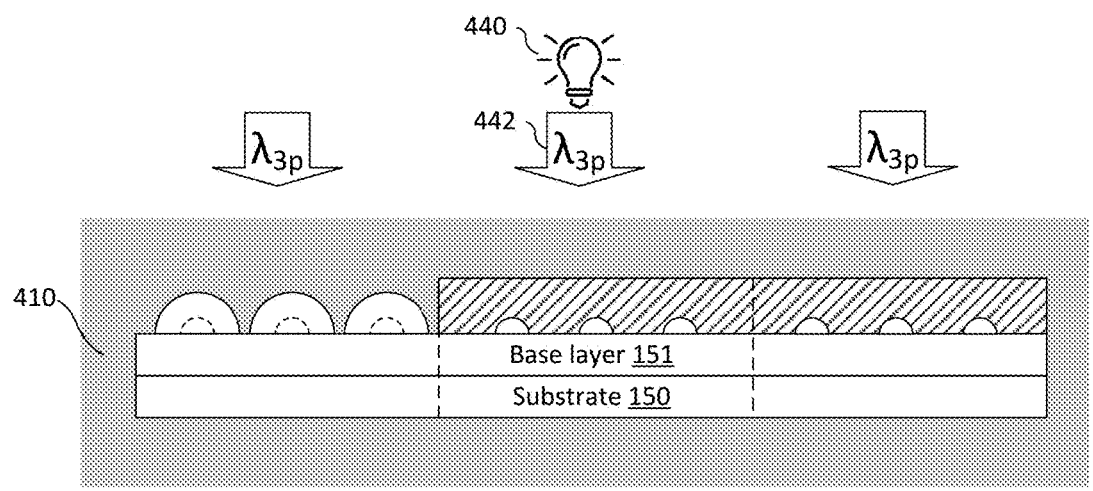

Referring to FIG. 5B, a first illumination-controlled growth step is performed. For example, the first illumination-controlled growth step involves immersing the substrate 150 in the quantum dot forming environment 410 and illuminating it with the third light 442. The quantum dots 460c of the third region 156 are illuminated with the third light 442 while being exposed to the forming environment 410, leading to illumination-controlled growth of the quantum dots 460c. However, the first mask layer 510 blocks the forming environment 410 from coming in contact with the quantum dots 460a and 460b of the first and second regions 152 and 154. As such, the quantum dots 460a and 460b do not grow during this illumination-controlled growth step. The first illumination-controlled growth step is completed when the quantum dots 460c of the third region 156 have reached their target dimension (e.g., $d_3$), at which point the forming environment 410 is removed to stop further growth and the first mask layer 510 is removed.

Figure 5C:
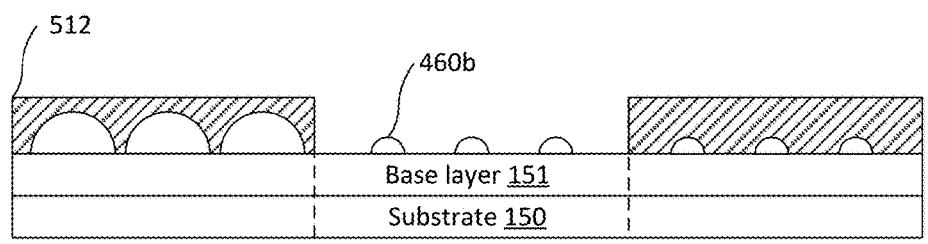

Referring to FIG. 5C, a second mask layer 512 is formed over the first and third regions 152 and 156. The second mask layer 512 can be formed in a manner analogous to the description of FIG. 2B, and similarly, the second mask layer 512 serves to cover the quantum dots 460a and 460c of the first and third regions 152 and 156 from the forming environment 410 during the following illumination-controlled growth step.

Figure 5D:
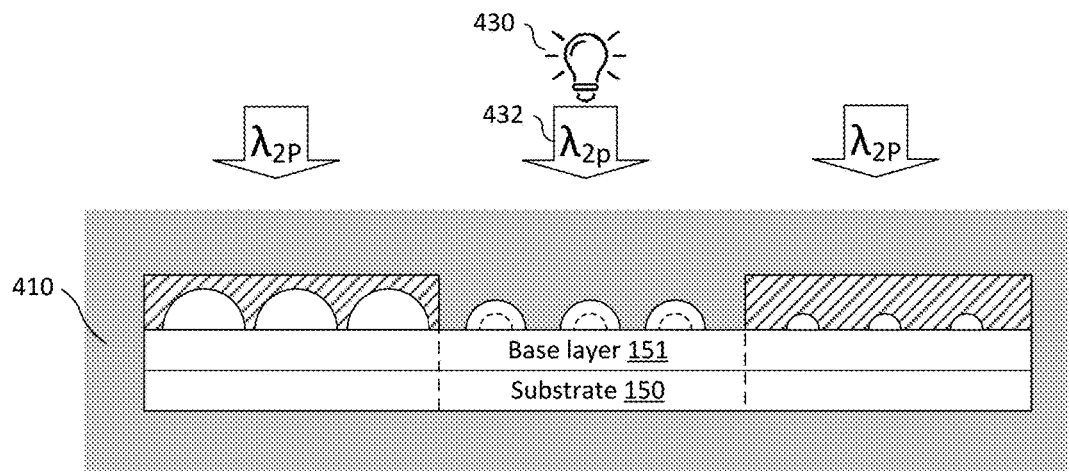

Referring to FIG. 5D, a second illumination-controlled growth step is performed. The second illumination-controlled growth step can be performed in a manner analogous to the description of FIG. 5B. At the conclusion of the second illumination-controlled growth step, the quantum dots 460b of the second region 154 have reached their target dimension (e.g., $d_2$).

Figure 5E:
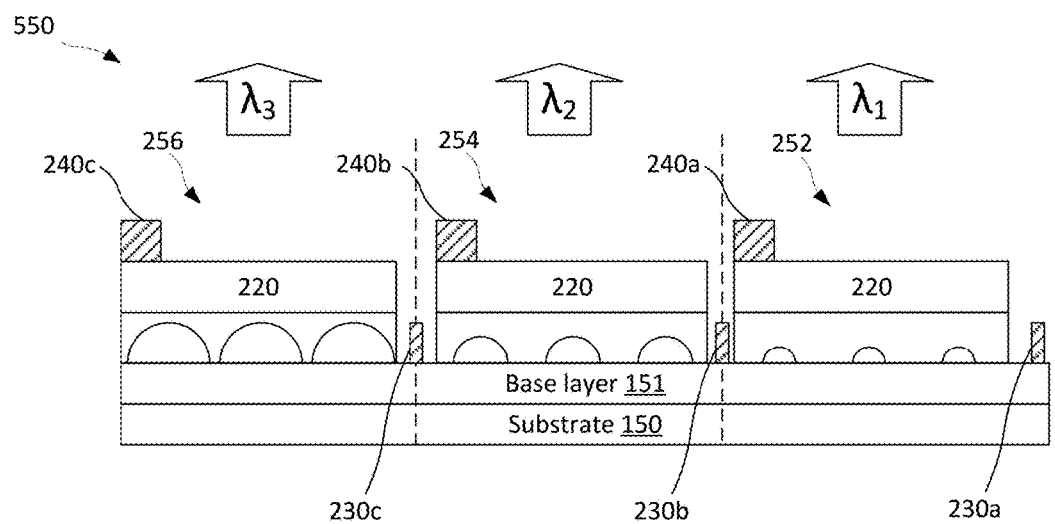

Referring to FIG. 5E, the grown layer of quantum dots 460 having 3 different dimensions are further processed to form a multi-color monolithic LED device 550 analogous to the multi-color monolithic LED device 250 of FIG. 2F. The further processing step can be performed in a manner analogous to the description of FIG. 2F.

While an example where the first and second mask layers 510 and 512 are directly covering the quantum dots has been described, in some implementations, patterned illumination can be used to selectively expose different regions of the substrate to the illumination as previously described. Use of patterned illumination can enable simultaneous growth of quantum dots across different regions, which can lead to a reduction in total growth time and improved process throughput.

While one example where the illumination wavelengths $\lambda_{1p}$ through $\lambda_{3p}$ where the illumination wavelengths coincide with the respective target emission wavelength has been described, in general, the illumination wavelengths can be offset from the target emission wavelengths to achieve desired control over the target emission wavelengths. Suitable offsets can be determined, among other factors, from the shape of the absorption spectrum, and the effect of the photo-generated carriers on the adsorption and desorption rate of particular materials in a particular forming environment.

In some implementations, a voltage source such at the voltage source 120 can be used to provide a bias voltage to the quantum dots 460 during growth. Such bias voltage may be used, for example, to modify characteristics of the growth process or to monitor the growth process.

Figure 6:
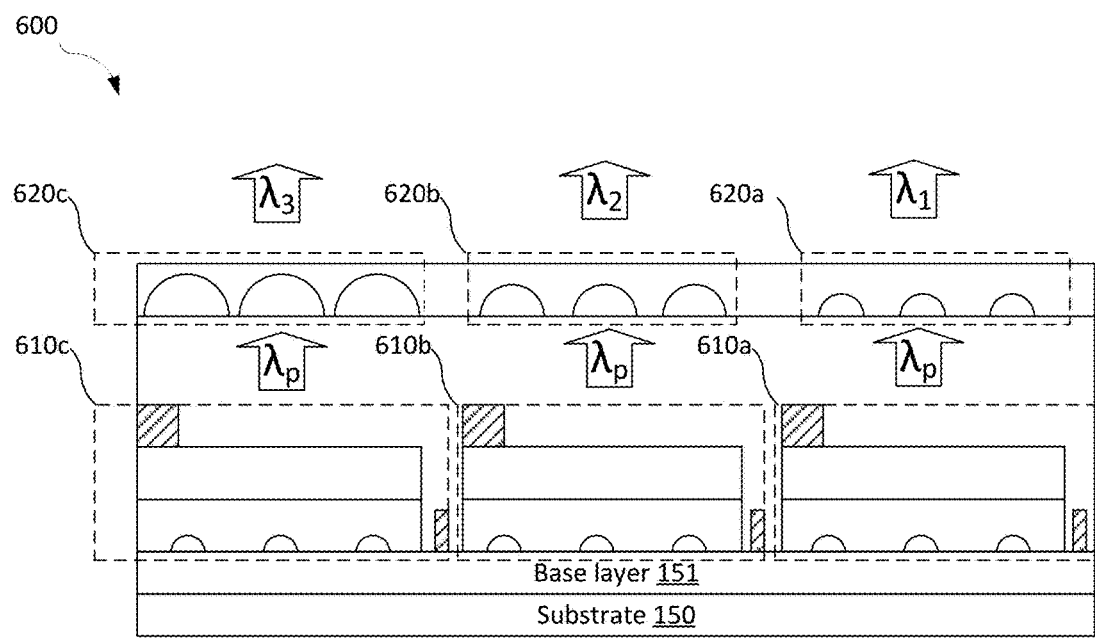
FIG. 6 shows a cross-sectional view of an example of an optically-pumped multi-color monolithic LED device.

Referring to FIG. 6, a cross-sectional view of an example of an optically-pumped multi-color monolithic LED device 600 is shown. The optically pumped multi-color monolithic LED device 600 includes pump diodes 610a-c, collectively referred to as pump diodes 610, and down-conversion elements 620a-c, collectively referred to as down-conversion elements 620.

The pump diodes 610 are LED devices that emit pump light at the pump wavelength $\lambda$ toward the down-conversion elements 620. The pump-diodes 610 can be fabricated, for example, using the process 200 or 500 for fabricating a multi-color monolithic LED. The dimensions of the quantum dots of the pump diodes are controlled during the fabrication process such that the pump-diodes emit light at wavelengths suitable for optical pumping of the down-conversion elements 620. In general, the pump wavelength $\lambda$ is shorter than the emission wavelengths of the down-conversion elements 620. For example, the pump diodes 610 can emit light in the ultraviolet wavelengths.

Down-conversion elements 620 are elements that absorb light at a shorter wavelength, which then re-emit light at a longer wavelength. Such process of converting light from a shorter wavelength to a longer wavelength is referred to as "down-conversion". Down-conversion elements 620 can be implemented using quantum dots. For example, the described techniques for forming and controlling the dimension of the quantum dots can be used in forming quantum dot-based down-conversion elements 620. For example, the element 620a can be quantum dots having dimension $d_1$, which emits light at $\lambda 1$. Similarly, the elements 620b and 620c can be quantum dots having dimension $d_2$ and $d_3$, which emits light at $\lambda_2$ and $\lambda_3$, respectively.

By turning on the pump diodes 610a-c, respective down-conversion elements 620a-c are optically pumped, which results in emission of light at wavelengths $\lambda_1$ through $\lambda_3$. As such, the device 600 can emit light of different colors, and be operated and used in manners analogous to the multi-color monolithic LED device 250 and 450.

The optically-pumped multi-color monolithic LED device 600 can be fabricated, for example, by performing a process similar to the process 200 or 500 for fabricating a multi-color monolithic LED, where masking steps and a second PEC etching step or a second illumination-controlled growth step are omitted. Once the pump diodes are formed, a second base layer can be formed on top of the pump diodes, and the down-conversion elements 620 can be fabricated on the second base layer using the described techniques for forming and controlling the dimension of the quantum dots. The down-conversion elements 620 may be passivated to mitigate performance degradation of the elements 620 due to, for example, surface oxidation or contamination. Examples of the passivation process include deposition of a protective layer such as polyimide or dielectric layers (e.g., $Al_2O_3$, $SiO_2$, and SiN).

In some implementations, the pump wavelength $\lambda_p$ can be the first emission wavelength $\lambda_1$. In such cases, the first down-conversion element 620a can be omitted. For example, the pump wavelength can be a blue wavelength, which can provide the blue color of an RGB LED device. As blue wavelength is shorter than the red and green, the blue pump wavelength can optically pump the down conversion elements 620b and 620c.

While processing of the substrate 150 having 3 non-overlapping regions 152, 154, and 156 have been described, in general, substrates with any number of regions can be processed using the described techniques. For example, a 2-color monolithic LED device can be formed with a 2-region processing, and a 4-color monolithic LED device can be formed with a 4-region processing.

A number of embodiments have been described. Nevertheless, it will be understood that various modifications may be made without departing from the spirit and scope of the invention. Accordingly, other embodiments are within the scope of the claims.

What is claimed is:

1. A process for producing a light emitting diode (LED) device, the process comprising:
    forming a plurality of quantum dots on a surface of a layer comprising a first area and a second area, the forming of the plurality of quantum dots comprising:
    exposing the first area of the surface to light having a first wavelength while exposing the first area to a quantum dot forming environment that, due at least in part to an interaction between the light at the first wavelength and the quantum dots, causes the quantum dots in the first area to form at a first growth rate while the quantum dots have a dimension less than a first threshold dimension, and at a second growth rate while the quantum dots have a dimension at or greater than the first threshold dimension, the first growth rate being higher than the second growth rate;
    exposing the second area of the surface to light having a second wavelength longer than the first wavelength while exposing the second area to the quantum dot forming environment that, due at least in part to an interaction between the light at the second wavelength and the quantum dots, causes the quantum dots in the second area to form at a third growth rate while the quantum dots have a dimension less than a second threshold dimension, and at a fourth growth rate while the quantum dots have a dimension at or greater than the second threshold dimension, the second threshold dimension being larger than the first threshold dimension, and the third growth rate being higher than the fourth growth rate; and
    processing the layer to form the LED device,
    wherein the quantum dots in the first area are sized to emit light substantially within a first band of wavelengths and the quantum dots in the second area are sized to emit light substantially within a second band of wavelengths different from the first band of wavelengths.

2. The process of claim 1, wherein the exposing the first area of the surface to light having a first wavelength while exposing the first area to a quantum dot forming environment comprises:
    depositing a first mask layer; and
    patterning an opening on the first mask layer, the opening corresponding to the first area, and
    wherein the exposing the second area of the surface to light having a second wavelength while exposing the first area to a quantum dot forming environment comprises:
    depositing a second mask layer; and
    patterning an opening on the second mask layer, the opening corresponding to the second area.

3. The process of claim 1, wherein the exposing the first area of the surface to light having a first wavelength while exposing the first area to a quantum dot forming environment comprises:
    illuminating only the first area of the surface to light having the first wavelength through patterned illumination, and
    wherein the exposing the second area of the surface to light having a second wavelength while exposing the first area to a quantum dot forming environment comprises:
    illuminating only the second area of the surface to light having the second wavelength through patterned illumination.

4. The process of claim 1, wherein the quantum dot forming environment is a gaseous environment.

5. The process of claim 4, wherein the forming of the plurality of quantum dots is performed under vacuum without breaking the vacuum.

6. The process of claim 1, wherein the quantum dot forming environment is a liquid environment.

7. The process of claim 1, wherein the forming a plurality of quantum dots on a surface of a layer comprising a first area and a second area further comprises:
    prior to the exposing the first area of the surface to light having a first wavelength while exposing the first area to a quantum dot forming environment, forming the quantum dots in the first and second areas to have an initial dimension at or less than the first threshold dimension.

8. The process of claim 1, wherein the light having the first wavelength and the light having the second wavelength are monochromatic light.

9. The process of claim 1, wherein the light having the first wavelength and the light have the second wavelength are generated by a laser source.

10. The process of claim 1, wherein the processing the layer to form the LED device comprises:
    forming a first anode corresponding to the first area;
    forming a second anode corresponding to the second area; and
    forming a shared cathode corresponding to both the first and second areas.

11. The process of claim 1, wherein the plurality of quantum dots is a first plurality of quantum dots and the layer is a first layer, and wherein the process further comprises:
    forming a second plurality of quantum dots on a surface of a second layer, the second layer and the first plurality of quantum dots arranged on opposite sides of the first layer, by:
    exposing the surface of the second layer to light having a third wavelength equal to or shorter than the first wavelength while exposing the surface of the second layer to the quantum dot forming environment that, due at least in part to an interaction between the light at the third wavelength and the quantum dots, forms the quantum dots on the surface of the second layer at a fifth growth rate while the quantum dots have a dimension less than a third threshold dimension, and at a sixth growth rate while the quantum dots have a dimension at or greater than the third threshold dimension, the fifth growth rate being higher than the sixth growth rate, wherein the second plurality of quantum dots are sized to emit light substantially within a third band of wavelengths shorter than the first and second bands of wavelengths.

12. The process of claim 1, wherein the forming of the plurality of quantum dots comprises performing one of metal-organic chemical vapor deposition, molecular beam epitaxy, or liquid phase epitaxy.

13. The process of claim 1, wherein the plurality of quantum dots comprises a light emitting material selected from the group consisting of Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium (III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

14. The process of claim 1, wherein the second and fourth growth rates are less than 6 monolayers/minute.

* * * * *